United States Patent
Lenehan et al.

(10) Patent No.: US 8,602,092 B2
(45) Date of Patent: Dec. 10, 2013

(54) PUMP AND FAN CONTROL CONCEPTS IN A COOLING SYSTEM

(75) Inventors: Daniel J. Lenehan, Los Altos Hills, CA (US); Kenneth Goodson, Belmont, CA (US); Thomas W. Kenny, San Carlos, CA (US); Mark Munch, Los Altos, CA (US); Saroj Sahu, Fremont, CA (US)

(73) Assignee: Cooligy, Inc., Mountain View, CA (US)

( * ) Notice: Subject to any disclaimer, the term of this patent is extended or adjusted under 35 U.S.C. 154(b) by 612 days.

(21) Appl. No.: 11/400,347

(22) Filed: Apr. 6, 2006

(65) Prior Publication Data

US 2006/0180300 A1    Aug. 17, 2006

Related U.S. Application Data

(62) Division of application No. 10/731,674, filed on Dec. 8, 2003, now Pat. No. 7,591,302.

(60) Provisional application No. 60/489,730, filed on Jul. 23, 2003.

(51) Int. Cl.
*F24F 11/06* (2006.01)

(52) U.S. Cl.
USPC ............................. 165/247; 62/180; 62/186

(58) Field of Classification Search
USPC ............................. 165/202, 247; 62/180, 186
See application file for complete search history.

(56) References Cited

U.S. PATENT DOCUMENTS

| 596,062 | A | 12/1897 | Firey |
| 2,087,521 | A | 7/1937 | Mazzola |
| 2,273,505 | A | 2/1942 | Florian |
| 2,737,341 | A | 3/1956 | Bitzer |
| 2,956,642 | A | 10/1960 | Chaplin et al. |
| 3,220,254 | A | 11/1965 | Halbech |

(Continued)

FOREIGN PATENT DOCUMENTS

| CN | 97212126.9 | 3/1997 | ............. B01D 61/42 |
| DE | 3314069 A1 | 11/1986 | |

(Continued)

OTHER PUBLICATIONS

Stephen C. Jacobson et al., "Fused Quartz Substrates for Microchip Electrophoresis", Analytical Chemistry, vol. 67, No. 13, Jul. 1, 1995 pp. 2059-2063, Chemical and Analytical Sciences Division, Oak Ridge National Laboratory, P.O. Box 2008, Oak Ridge, Tennessee 37831-6142.

(Continued)

*Primary Examiner* — Ljiljana Ciric
(74) *Attorney, Agent, or Firm* — Haverstock & Owens, LLP

(57) ABSTRACT

A closed loop cooling system and apparatus for controlling a fluid flow rate through the closed loop cooling system, the apparatus comprising a heat exchanger coupled to at least one heat generating device for removing waste heat from the heat generating device, at least one pump for circulating the fluid, a heat rejector for receiving the fluid, at least one fan for removing waste heat from the heat rejector, at least one temperature sensor coupled to the heat generating device to measure the temperature value of the at least one heat generating device, and a controller electrically coupled to the at least one pump, the at least one fan, and the at least one temperature sensor for receiving the temperature value to selectively control the fluid flow rate and the air flow rate, based on the temperature value.

39 Claims, 6 Drawing Sheets

(56) References Cited

U.S. PATENT DOCUMENTS

| | | |
|---|---|---|
| 3,267,859 A | 8/1966 | Jutila |
| 3,361,195 A | 1/1968 | Meyerhoff |
| 3,514,967 A * | 6/1970 | Vander .................... 62/180 |
| 3,524,497 A | 8/1970 | Chu et al. .................. 165/80 |
| 3,554,669 A | 1/1971 | Reader |
| 3,654,988 A | 4/1972 | Clayton, III |
| 3,800,510 A | 4/1974 | Lamond |
| 3,817,321 A | 6/1974 | von Cube et al. |
| 3,823,572 A | 7/1974 | Cochran, Jr. |
| 3,852,806 A | 12/1974 | Corman et al. ............. 357/82 |
| 3,923,426 A | 12/1975 | Theeuwes |
| 3,929,154 A | 12/1975 | Goodwin |
| 3,993,123 A | 11/1976 | Chu et al. .................. 165/80 |
| 4,021,867 A | 5/1977 | Maxwell, Jr. |
| 4,037,889 A | 7/1977 | Piatt |
| 4,109,707 A | 8/1978 | Wilson et al. |
| 4,138,996 A | 2/1979 | Cartland |
| 4,194,559 A | 3/1980 | Eastman |
| 4,211,208 A | 7/1980 | Lindner |
| 4,248,295 A | 2/1981 | Ernst et al. |
| 4,262,975 A | 4/1981 | Heshmat et al. |
| 4,273,082 A | 6/1981 | Tholen .................... 123/41.31 |
| 4,296,455 A | 10/1981 | Leaycraft ................. 361/383 |
| 4,332,291 A | 6/1982 | Mulock-Bentley ........... 165/76 |
| 4,392,362 A | 7/1983 | Little |
| 4,395,947 A | 8/1983 | Despot |
| 4,409,079 A | 10/1983 | Miyazaki et al. |
| 4,416,324 A * | 11/1983 | Sutoh et al. ............... 165/202 |
| 4,485,429 A | 11/1984 | Mittal |
| 4,497,875 A | 2/1985 | Arakawa et al. |
| 4,561,040 A | 12/1985 | Eastman et al. |
| 4,568,431 A | 2/1986 | Polan et al. ................. 204/13 |
| 4,664,181 A | 5/1987 | Sumberg |
| 4,687,167 A | 8/1987 | Skalka et al. |
| 4,759,403 A | 7/1988 | Flint et al. |
| 4,791,983 A | 12/1988 | Nicol et al. ............... 165/80.4 |
| 4,793,405 A | 12/1988 | Diggelmann et al. ... 165/104.33 |
| 4,866,570 A | 9/1989 | Porter |
| 4,884,331 A | 12/1989 | Hinshaw ..................... 29/558 |
| 4,894,709 A | 1/1990 | Phillips et al. |
| 4,896,719 A | 1/1990 | O'Neill et al. |
| 4,908,112 A | 3/1990 | Pace |
| 4,962,761 A * | 10/1990 | Golden ...................... 607/104 |
| 4,978,638 A | 12/1990 | Buller et al. ............... 437/209 |
| 5,009,760 A | 4/1991 | Zare et al. |
| 5,016,090 A | 5/1991 | Galyon et al. ............... 357/82 |
| 5,027,611 A * | 7/1991 | Doi et al. .................... 165/202 |
| 5,036,676 A * | 8/1991 | Dudley ....................... 62/180 |
| 5,058,627 A | 10/1991 | Brannen |
| 5,070,040 A | 12/1991 | Pankove |
| 5,088,005 A | 2/1992 | Ciaccio |
| 5,096,388 A | 3/1992 | Weinberg |
| 5,099,311 A | 3/1992 | Bonde et al. |
| 5,099,910 A | 3/1992 | Walpole et al. |
| 5,125,451 A | 6/1992 | Matthews |
| 5,131,233 A | 7/1992 | Cray et al. |
| 5,199,487 A | 4/1993 | DiFrancesco et al. ........ 165/168 |
| 5,203,401 A | 4/1993 | Hamburgen et al. |
| 5,218,515 A | 6/1993 | Bernhardt |
| 5,219,278 A | 6/1993 | Van Lintel |
| 5,232,047 A | 8/1993 | Matthews |
| 5,239,200 A | 8/1993 | Messina et al. |
| 5,247,800 A | 9/1993 | Mruzek et al. ................ 62/51.1 |
| 5,263,251 A | 11/1993 | Matthews |
| 5,269,372 A | 12/1993 | Chu et al. ................. 165/80.4 |
| 5,274,920 A | 1/1994 | Mathews |
| 5,275,237 A | 1/1994 | Rolfson et al. ............. 165/80.5 |
| 5,294,834 A | 3/1994 | Fatemi et al. ............... 257/745 |
| 5,299,635 A | 4/1994 | Abraham .................... 165/173 |
| 5,307,236 A | 4/1994 | Rio et al. .................... 361/720 |
| 5,308,429 A | 5/1994 | Bradley ................... 156/306.6 |
| 5,309,319 A | 5/1994 | Messina |
| 5,316,077 A | 5/1994 | Reichard ................. 165/104.28 |
| 5,317,805 A | 6/1994 | Hoopman et al. |
| 5,325,265 A | 6/1994 | Turlik et al. |
| 5,336,062 A | 8/1994 | Richter |
| 5,354,415 A | 10/1994 | Fushii et al. |
| 5,365,400 A | 11/1994 | Ashiwake et al. ............ 361/752 |
| 5,371,529 A | 12/1994 | Eguchi et al. |
| 5,371,665 A * | 12/1994 | Quisenberry et al. ........... 62/3.3 |
| 5,380,956 A | 1/1995 | Loo et al. |
| 5,383,340 A | 1/1995 | Larson et al. |
| 5,388,635 A | 2/1995 | Gruber et al. ............... 165/80.4 |
| 5,424,918 A | 6/1995 | Felps et al. ................. 361/704 |
| 5,427,174 A | 6/1995 | Lomolino, Sr. et al. |
| 5,436,793 A | 7/1995 | Sanwo et al. |
| 5,441,613 A | 8/1995 | McCormick et al. |
| 5,459,099 A | 10/1995 | Hsu |
| 5,488,835 A * | 2/1996 | Howenstine et al. ........... 62/186 |
| 5,514,906 A | 5/1996 | Love et al. |
| 5,520,244 A | 5/1996 | Mundinger et al. ..... 165/104.33 |
| 5,534,328 A | 7/1996 | Ashmead et al. |
| 5,534,471 A | 7/1996 | Carolan et al. |
| 5,544,696 A | 8/1996 | Leland |
| 5,548,605 A | 8/1996 | Benett et al. |
| 5,564,497 A | 10/1996 | Fukuoka et al. |
| 5,579,828 A | 12/1996 | Reed et al. |
| 5,583,317 A | 12/1996 | Mennucci et al. |
| 5,585,069 A | 12/1996 | Zanzucchi et al. |
| 5,590,242 A | 12/1996 | Juang et al. ................ 395/2.54 |
| 5,622,221 A * | 4/1997 | Genga et al. ................ 165/247 |
| 5,632,876 A | 5/1997 | Zanzucchi et al. |
| 5,641,400 A | 6/1997 | Kaltenbach et al. |
| 5,647,429 A | 7/1997 | Oktay et al. |
| 5,676,198 A | 10/1997 | Schneider et al. |
| 5,685,966 A | 11/1997 | Aaron et al. |
| 5,692,558 A | 12/1997 | Hamilton et al. |
| 5,696,405 A | 12/1997 | Weld |
| 5,701,751 A | 12/1997 | Flores |
| 5,703,536 A * | 12/1997 | Davis et al. .................... 330/66 |
| 5,704,416 A | 1/1998 | Larson et al. |
| 5,711,155 A * | 1/1998 | DeVilbiss et al. ............... 62/3.3 |
| 5,726,495 A | 3/1998 | Aihara et al. ................ 257/722 |
| 5,727,618 A | 3/1998 | Mundinger et al. |
| 5,731,954 A | 3/1998 | Cheon ........................ 361/699 |
| 5,757,070 A | 5/1998 | Fritz |
| 5,759,014 A | 6/1998 | Van Lintel |
| 5,761,037 A | 6/1998 | Anderson et al. ............ 361/700 |
| 5,763,951 A | 6/1998 | Hamilton et al. |
| 5,800,690 A | 9/1998 | Chow et al. |
| 5,801,442 A | 9/1998 | Hamilton et al. |
| 5,810,077 A | 9/1998 | Nakamura et al. |
| 5,811,062 A | 9/1998 | Wegeng et al. ............... 422/129 |
| 5,829,514 A | 11/1998 | Smith et al. ..................... 165/78 |
| 5,830,806 A | 11/1998 | Hudson et al. ............... 438/690 |
| 5,835,345 A | 11/1998 | Staskus et al. |
| 5,836,750 A | 11/1998 | Cabuz |
| 5,839,290 A | 11/1998 | Nazeri |
| 5,847,452 A | 12/1998 | Tantoush |
| 5,858,188 A | 1/1999 | Soane et al. |
| 5,863,708 A | 1/1999 | Zanzucchi et al. |
| 5,869,004 A | 2/1999 | Parce et al. |
| 5,870,823 A | 2/1999 | Bezama et al. |
| 5,874,795 A | 2/1999 | Sakamoto |
| 5,876,655 A | 3/1999 | Fisher |
| 5,880,017 A | 3/1999 | Schwiebert et al. |
| 5,880,524 A | 3/1999 | Xie |
| 5,887,557 A | 3/1999 | Battlogg |
| 5,896,869 A | 4/1999 | Maniscalco et al. |
| 5,901,037 A | 5/1999 | Hamilton et al. |
| 5,936,192 A | 8/1999 | Tauchi |
| 5,937,557 A | 8/1999 | Bowker et al. ................. 42/70.1 |
| 5,940,270 A | 8/1999 | Puckett |
| 5,942,093 A | 8/1999 | Rakestraw et al. |
| 5,950,721 A | 9/1999 | Bock et al. |
| 5,953,701 A | 9/1999 | Neti et al. .................... 704/254 |
| 5,960,384 A | 9/1999 | Brash .............................. 704/9 |
| 5,964,092 A * | 10/1999 | Tozuka et al. ................... 62/3.7 |
| 5,965,001 A | 10/1999 | Chow et al. |
| 5,965,813 A | 10/1999 | Wan et al. |
| 5,978,220 A | 11/1999 | Frey et al. |
| 5,983,997 A | 11/1999 | Hou ............................. 165/144 |
| 5,989,402 A | 11/1999 | Chow et al. |
| 5,997,713 A | 12/1999 | Beetz, Jr. et al. |

(56) References Cited

U.S. PATENT DOCUMENTS

| | | |
|---|---|---|
| 5,998,240 A | 12/1999 | Hamilton et al. |
| 6,007,309 A | 12/1999 | Hartley |
| 6,010,316 A | 1/2000 | Haller |
| 6,012,902 A | 1/2000 | Parce |
| 6,013,164 A | 1/2000 | Paul et al. |
| 6,014,312 A | 1/2000 | Schulz-Harder et al. |
| 6,019,165 A | 2/2000 | Batchelder ................ 165/80.3 |
| 6,019,882 A | 2/2000 | Paul et al. |
| 6,021,045 A | 2/2000 | Johnson .................... 361/704 |
| 6,054,034 A | 4/2000 | Soane et al. |
| 6,068,752 A | 5/2000 | Dubrow et al. |
| 6,069,791 A | 5/2000 | Goto et al. |
| 6,084,178 A | 7/2000 | Cromwell .................... 174/35 |
| 6,086,330 A | 7/2000 | Press et al. ................. 416/223 |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A | 8/2000 | Fuesser et al. |
| 6,103,199 A | 8/2000 | Bjornson et al. |
| 6,105,373 A | 8/2000 | Watanabe et al. ............ 62/3.7 |
| 6,106,685 A | 8/2000 | McBride et al. |
| 6,119,729 A | 9/2000 | Oberholzer et al. |
| 6,126,723 A | 10/2000 | Drost et al. |
| 6,129,145 A | 10/2000 | Yamamoto et al. |
| 6,131,650 A | 10/2000 | North et al. |
| 6,146,103 A | 11/2000 | Lee et al. |
| 6,154,226 A | 11/2000 | York et al. |
| 6,154,363 A | 11/2000 | Chang |
| 6,159,353 A | 12/2000 | West et al. |
| 6,166,907 A | 12/2000 | Chien ......................... 361/699 |
| 6,171,067 B1 | 1/2001 | Parce |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,210,986 B1 | 4/2001 | Arnold et al. |
| 6,216,343 B1 | 4/2001 | Leland et al. |
| 6,221,226 B1 | 4/2001 | Kopf-Sill |
| 6,227,287 B1 | 5/2001 | Tanaka et al. .............. 165/80.4 |
| 6,227,809 B1 | 5/2001 | Forster et al. |
| 6,234,240 B1 | 5/2001 | Cheon |
| 6,238,538 B1 | 5/2001 | Parce et al. |
| 6,251,254 B1 | 6/2001 | Katoh et al. |
| 6,253,835 B1 | 7/2001 | Chu et al. ................... 165/80.4 |
| 6,260,579 B1 | 7/2001 | Yokota et al. |
| 6,269,864 B1 | 8/2001 | Kabadi |
| 6,272,012 B1 | 8/2001 | Medin et al. ................ 361/690 |
| 6,277,257 B1 | 8/2001 | Paul et al. |
| 6,287,440 B1 | 9/2001 | Arnold et al. |
| 6,293,333 B1 | 9/2001 | Ponnappan et al. |
| 6,295,819 B1 * | 10/2001 | Mathiprakasam et al. ...... 62/3.3 |
| 6,301,109 B1 | 10/2001 | Chu et al. |
| 6,313,992 B1 | 11/2001 | Hildebrandt |
| 6,317,326 B1 | 11/2001 | Vogel et al. |
| 6,321,791 B1 | 11/2001 | Chow et al. |
| 6,322,753 B1 | 11/2001 | Lindberg et al. |
| 6,324,058 B1 | 11/2001 | Hsiao |
| 6,324,075 B1 | 11/2001 | Unrein et al. ............... 361/816 |
| 6,337,794 B1 | 1/2002 | Agonafer et al. |
| 6,347,036 B1 | 2/2002 | Yeager et al. ............... 361/687 |
| 6,351,384 B1 | 2/2002 | Daikoku et al. |
| 6,360,814 B1 | 3/2002 | Tanaka et al. ............ 165/104.33 |
| 6,366,462 B1 | 4/2002 | Chu et al. ................... 361/699 |
| 6,381,846 B2 | 5/2002 | Insley et al. .............. 29/890.039 |
| 6,385,044 B1 | 5/2002 | Colbert et al. ............. 361/700 |
| 6,388,317 B1 | 5/2002 | Reese |
| 6,388,385 B1 | 5/2002 | McGinn et al. |
| 6,396,706 B1 | 5/2002 | Wohlfarth ................... 361/760 |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. |
| 6,416,642 B1 | 7/2002 | Alajoki et al. |
| 6,417,060 B2 | 7/2002 | Tavkhelidze et al. |
| 6,424,531 B1 | 7/2002 | Bhatti |
| 6,431,260 B1 | 8/2002 | Agonafer et al. |
| 6,438,984 B1 | 8/2002 | Novotny et al. |
| 6,443,222 B1 | 9/2002 | Yun et al. |
| 6,443,704 B1 | 9/2002 | Darabi et al. |
| 6,444,461 B1 | 9/2002 | Knapp et al. |
| 6,457,515 B1 | 10/2002 | Vafai et al. |
| 6,469,893 B1 | 10/2002 | Frutschy et al. ............. 361/700 |
| 6,478,258 B1 | 11/2002 | Yee ............................. 244/163 |
| 6,492,018 B1 | 12/2002 | Guddal |
| 6,493,221 B2 | 12/2002 | Harrison et al. |
| 6,495,015 B1 | 12/2002 | Schoeniger et al. |
| 6,519,151 B2 | 2/2003 | Chu et al. .................... 361/699 |
| 6,527,835 B1 | 3/2003 | Manginell et al. ............ 96/102 |
| 6,533,840 B2 | 3/2003 | Martin et al. |
| 6,536,510 B2 | 3/2003 | Khrustalev et al. ...... 165/104.33 |
| 6,536,516 B2 | 3/2003 | Davies et al. ................. 165/170 |
| 6,537,437 B1 | 3/2003 | Galambos et al. |
| 6,543,521 B1 | 4/2003 | Sato et al. |
| 6,553,253 B1 | 4/2003 | Chang |
| 6,572,749 B1 | 6/2003 | Paul et al. |
| 6,574,597 B1 | 6/2003 | Mohri et al. ................. 704/251 |
| 6,578,626 B1 | 6/2003 | Calaman et al. ............. 165/80.4 |
| 6,581,388 B2 | 6/2003 | Novotny et al. |
| 6,587,343 B2 | 7/2003 | Novotny et al. |
| 6,588,498 B1 | 7/2003 | Reyzin et al. |
| 6,591,625 B1 | 7/2003 | Simon |
| 6,596,229 B2 | 7/2003 | Lin et al. |
| 6,606,251 B1 | 8/2003 | Kenny, Jr. et al. |
| 6,626,236 B1 | 9/2003 | Bandoh et al. ............... 165/206 |
| 6,632,655 B1 | 10/2003 | Mehta et al. |
| 6,643,132 B2 | 11/2003 | Faneuf et al. ................ 361/700 |
| 6,645,232 B2 * | 11/2003 | Carson ......................... 607/104 |
| 6,657,121 B2 | 12/2003 | Garner ......................... 174/16.3 |
| 5,862,038 A1 | 1/2004 | Lee et al. |
| 6,675,875 B1 | 1/2004 | Vafai et al. .................. 165/80.4 |
| 6,678,168 B2 | 1/2004 | Kenny, Jr. et al. |
| 6,679,315 B2 | 1/2004 | Cosley et al. ................ 165/80.4 |
| 6,700,785 B2 | 3/2004 | Berry et al. ................... 361/726 |
| 6,718,781 B2 | 4/2004 | Freund et al. ................. 62/199 |
| 6,719,535 B2 | 4/2004 | Rakestraw et al. |
| 6,729,383 B1 | 5/2004 | Cannell et al. ............... 165/80.3 |
| 6,757,169 B2 | 6/2004 | Kondo et al. ................. 361/699 |
| 6,763,880 B1 | 7/2004 | Shih ............................. 165/80.4 |
| 6,770,183 B1 | 8/2004 | Hencken et al. |
| 6,787,052 B1 | 9/2004 | Vaganov ........................ 216/57 |
| 6,795,312 B2 | 9/2004 | Narakino et al. ............. 361/687 |
| 6,796,372 B2 | 9/2004 | Bear |
| 6,807,056 B2 | 10/2004 | Kondo et al. |
| 6,826,922 B2 | 12/2004 | Patel et al. ..................... 62/185 |
| 6,829,142 B2 | 12/2004 | Belady et al. ................. 361/687 |
| 6,836,131 B2 | 12/2004 | Cader et al. .................. 324/760 |
| 6,863,117 B2 | 3/2005 | Valenzuela |
| 6,865,081 B2 | 3/2005 | Meyer et al. ................. 361/699 |
| 6,881,039 B2 | 4/2005 | Corbin et al. |
| 6,882,543 B2 | 4/2005 | Kenny, Jr. et al. |
| 6,903,929 B2 | 6/2005 | Prasher et al. ............... 361/699 |
| 6,934,154 B2 | 8/2005 | Prasher et al. ............... 361/699 |
| 6,942,018 B2 | 9/2005 | Goodson et al. |
| 6,945,324 B2 * | 9/2005 | Weng ............................ 165/247 |
| 6,955,212 B1 | 10/2005 | Hsieh ........................... 165/80.4 |
| 6,967,842 B2 | 11/2005 | Aoki et al. |
| 6,986,382 B2 | 1/2006 | Upadhya et al. ............. 165/80.4 |
| 6,988,534 B2 | 1/2006 | Kenny et al. |
| 6,988,535 B2 | 1/2006 | Upadhya et al. |
| 6,988,546 B1 | 1/2006 | Ohki |
| 6,992,891 B2 | 1/2006 | Mallik et al. ................. 361/704 |
| 6,994,151 B2 | 2/2006 | Zhou et al. |
| 7,009,843 B2 | 3/2006 | Lee et al. ..................... 361/704 |
| 7,017,654 B2 | 3/2006 | Kenny et al. |
| 7,019,972 B2 | 3/2006 | Kenny, Jr. et al. |
| 7,021,369 B2 | 4/2006 | Werner et al. |
| 7,044,196 B2 | 5/2006 | Shook et al. |
| 7,050,308 B2 | 5/2006 | Kenny, Jr. et al. |
| 7,061,104 B2 | 6/2006 | Kenny, Jr. et al. |
| 7,077,634 B2 | 7/2006 | Munch et al. |
| 7,086,839 B2 | 8/2006 | Kenny et al. |
| 7,090,001 B2 | 8/2006 | Zhou et al. |
| 7,120,021 B2 | 10/2006 | Hamman ..................... 361/699 |
| 7,154,749 B2 | 12/2006 | Stefanoski et al. ........... 361/695 |
| 7,156,159 B2 | 1/2007 | Lovette et al. |

(56) References Cited

U.S. PATENT DOCUMENTS

| | | | |
|---|---|---|---|
| 7,178,512 B1 | 2/2007 | Merten | |
| 7,184,269 B2 | 2/2007 | Campbell et al. | 361/700 |
| 7,188,662 B2 | 3/2007 | Brewer et al. | |
| 7,201,012 B2 | 4/2007 | Munch et al. | |
| 7,201,214 B2 | 4/2007 | Munch et al. | |
| 7,218,523 B2 | 5/2007 | Hamman | |
| 7,243,704 B2 | 7/2007 | Tustaniwskyi et al. | 165/80 |
| 7,254,957 B2 | 8/2007 | Weber et al. | 62/259.2 |
| 7,278,269 B2 | 10/2007 | Pham et al. | |
| 7,278,549 B2 | 10/2007 | Munch et al. | |
| 7,280,363 B2 | 10/2007 | Reyzin et al. | 361/719 |
| 7,293,423 B2 | 11/2007 | Upadhya et al. | |
| 7,301,773 B2 | 11/2007 | Brewer et al. | 361/719 |
| 7,310,953 B2 | 12/2007 | Pham et al. | |
| 7,325,588 B2 | 2/2008 | Malone et al. | |
| 7,334,630 B2 | 2/2008 | Goodson et al. | 165/104.33 |
| 7,344,363 B2 | 3/2008 | Munch et al. | |
| 7,359,197 B2 | 4/2008 | Stefanoski et al. | |
| 7,398,821 B2 * | 7/2008 | Rainer et al. | 165/247 |
| 7,402,029 B2 | 7/2008 | Munch et al. | |
| 7,449,122 B2 | 11/2008 | Corbin et al. | |
| 7,455,103 B2 | 11/2008 | Sato et al. | 165/299 |
| 7,462,852 B2 | 12/2008 | Appleby et al. | |
| 7,509,995 B2 | 3/2009 | Bhatti et al. | |
| 7,633,752 B2 | 12/2009 | Prasher | |
| 7,686,069 B2 | 3/2010 | Parish, IV et al. | |
| 7,715,194 B2 | 5/2010 | Brewer et al. | |
| 7,782,616 B1 | 8/2010 | Myers et al. | |
| 8,254,422 B2 | 8/2012 | Datta et al. | |
| 2001/0016985 A1 | 8/2001 | Insley et al. | |
| 2001/0024820 A1 | 9/2001 | Mastromatteo et al. | |
| 2001/0044155 A1 | 11/2001 | Paul et al. | |
| 2001/0045270 A1 | 11/2001 | Bhatti et al. | |
| 2001/0046703 A1 | 11/2001 | Burns et al. | |
| 2001/0055714 A1 | 12/2001 | Cettour-Rose et al. | |
| 2002/0011330 A1 | 1/2002 | Insley et al. | |
| 2002/0031948 A1 | 3/2002 | Yasufuku et al. | 439/625 |
| 2002/0039279 A1 | 4/2002 | Ishikawa et al. | |
| 2002/0051341 A1 | 5/2002 | Frutschy et al. | 361/700 |
| 2002/0075645 A1 | 6/2002 | Kitano et al. | |
| 2002/0079095 A1 | 6/2002 | Davies et al. | |
| 2002/0080578 A1 | 6/2002 | Xie | |
| 2002/0096312 A1 | 7/2002 | Korin | |
| 2002/0121105 A1 | 9/2002 | McCarthy et al. | |
| 2002/0134543 A1 | 9/2002 | Estes et al. | 165/277 |
| 2002/0152761 A1 | 10/2002 | Patel et al. | 62/259.2 |
| 2003/0022505 A1 | 1/2003 | Ouellet et al. | |
| 2003/0056368 A1 | 3/2003 | Nyqvist | |
| 2003/0062149 A1 | 4/2003 | Goodson et al. | |
| 2003/0077474 A1 | 4/2003 | Rabinkin et al. | |
| 2003/0097846 A1 | 5/2003 | Novotny et al. | 62/3.7 |
| 2003/0121274 A1 | 7/2003 | Wightman | |
| 2003/0123228 A1 | 7/2003 | Bhatia et al. | 361/705 |
| 2004/0008483 A1 | 1/2004 | Cheon | 361/687 |
| 2004/0012927 A1 | 1/2004 | Lee et al. | |
| 2004/0040695 A1 | 3/2004 | Chesser et al. | |
| 2004/0050231 A1 | 3/2004 | Chu et al. | 83/574 |
| 2004/0052049 A1 | 3/2004 | Wu et al. | 361/699 |
| 2004/0057211 A1 | 3/2004 | Kondo et al. | 361/696 |
| 2004/0089008 A1 | 5/2004 | Titlon et al. | |
| 2004/0099410 A1 | 5/2004 | Ghosh | 165/185 |
| 2004/0112585 A1 | 6/2004 | Goodson et al. | 165/299 |
| 2004/0120827 A1 | 6/2004 | Kim et al. | |
| 2004/0188059 A1 | 9/2004 | Todd, Jr. et al. | |
| 2004/0188076 A1 | 9/2004 | Lee | 165/174 |
| 2004/0206477 A1 | 10/2004 | Kenny et al. | 165/80.4 |
| 2004/0216863 A1 | 11/2004 | Hu | 165/110 |
| 2004/0221604 A1 | 11/2004 | Ota et al. | 62/259.2 |
| 2005/0024832 A1 | 2/2005 | Lee et al. | |
| 2005/0082666 A1 | 4/2005 | Lee et al. | 257/728 |
| 2005/0083657 A1 | 4/2005 | Hamman | 361/699 |
| 2005/0084385 A1 | 4/2005 | Corbin et al. | 417/53 |
| 2005/0117298 A1 | 6/2005 | Koga et al. | 361/699 |
| 2005/0133200 A1 | 6/2005 | Malone et al. | 165/80.4 |
| 2005/0231914 A1 | 10/2005 | Mikubo et al. | 361/699 |
| 2005/0247433 A1 | 11/2005 | Corrado et al. | 165/80.4 |
| 2005/0257532 A1 | 11/2005 | Ikeda et al. | 62/3.7 |
| 2005/0259393 A1 | 11/2005 | Vinson et al. | 361/690 |
| 2005/0270742 A1 | 12/2005 | Brewer et al. | 361/696 |
| 2006/0037739 A1 | 2/2006 | Utsunomiya | 165/104.33 |
| 2006/0056156 A1 | 3/2006 | Long et al. | 361/704 |
| 2006/0060333 A1 | 3/2006 | Chordia et al. | 165/104.33 |
| 2006/0076122 A1 | 4/2006 | Huang et al. | |
| 2006/0102999 A1 | 5/2006 | Tustaniwskyi et al. | 257/688 |
| 2006/0133039 A1 | 6/2006 | Belady | 361/699 |
| 2006/0139882 A1 | 6/2006 | Mikubo et al. | 361/699 |
| 2006/0161311 A1 | 7/2006 | Vinson et al. | 700/300 |
| 2006/0171113 A1 | 8/2006 | Wu | |
| 2006/0187639 A1 | 8/2006 | Carswell | 361/699 |
| 2006/0219388 A1 | 10/2006 | Terakado et al. | |
| 2006/0237166 A1 | 10/2006 | Otey et al. | |
| 2006/0245987 A1 | 11/2006 | Schmidt | |
| 2007/0042514 A1 | 2/2007 | Wu et al. | |
| 2007/0053161 A1 | 3/2007 | Giardina et al. | |
| 2007/0084585 A1 | 4/2007 | Takagi et al. | |
| 2007/0098143 A1 | 5/2007 | Thangamani et al. | |
| 2007/0109739 A1 | 5/2007 | Stefanoski | |
| 2007/0115634 A1 | 5/2007 | Laing | 361/699 |
| 2007/0152352 A1 | 7/2007 | McKinnell et al. | |
| 2007/0227708 A1 | 10/2007 | Hom et al. | |
| 2007/0235167 A1 | 10/2007 | Brewer et al. | |
| 2007/0267181 A1 | 11/2007 | Lin et al. | |
| 2008/0013283 A1 | 1/2008 | Gilbert et al. | 361/715 |
| 2008/0024992 A1 | 1/2008 | Pflueger | |
| 2008/0110963 A1 | 5/2008 | Lin et al. | |
| 2009/0046430 A1 | 2/2009 | Brewer et al. | |
| 2009/0159241 A1 | 6/2009 | Lipp et al. | |
| 2009/0183725 A1 | 7/2009 | Yukimoto | |
| 2009/0225513 A1 | 9/2009 | Correa et al. | |
| 2009/0262495 A1 | 10/2009 | Neudorfer | |
| 2010/0132640 A1 | 6/2010 | Methley et al. | |
| 2011/0073292 A1 | 3/2011 | Datta et al. | |

FOREIGN PATENT DOCUMENTS

| | | | |
|---|---|---|---|
| DE | 3927755 A1 | 2/1991 | |
| DE | 42 42 841 | 11/1997 | G01K 7/02 |
| DE | 19628548 A1 | 1/1998 | |
| DE | 29717480 U1 | 2/1998 | |
| DE | 197 10 716 C2 | 9/1998 | H01S 5/024 |
| DE | 197 15 001 A1 | 12/1998 | |
| DE | 69413012 T2 | 3/1999 | |
| DE | 69511875 T2 | 3/2000 | |
| DE | 35406777 1 | 1/2001 | |
| DE | 10141525 A1 | 3/2003 | |
| DE | 10319367 A1 | 11/2004 | |
| DE | 102004042154 A1 | 3/2006 | |
| EP | 0 520 173 A2 | 12/1992 | |
| EP | 0720720 B1 | 1/1998 | |
| EP | 0845728 A2 | 3/1998 | |
| EP | 1003006 A1 | 5/2000 | |
| EP | 1 154 476 A1 | 11/2001 | H01L 23/373 |
| EP | 1153690 A1 | 11/2001 | |
| EP | 1 520 993 A2 | 6/2005 | F04D 29/58 |
| JP | 60046056 | 12/1985 | |
| JP | 3070197 A | 3/1991 | |
| JP | 5304383 | 11/1993 | |
| JP | 9298380 | 11/1997 | |
| JP | 10-99592 | 4/1998 | D06F 39/08 |
| JP | 10223811 | 8/1998 | H01L 23/36 |
| JP | 410208781 A | 8/1998 | H01M 10/50 |
| JP | 2000-277540 | 10/2000 | H01L 21/50 |
| JP | 2001-326311 | 11/2001 | H01L 23/427 |
| JP | 2004363308 A | 12/2004 | |
| TW | 183247 | 5/1992 | |
| TW | 49131 | 6/2002 | |
| TW | 495062 | 7/2002 | G06F 1/20 |
| TW | 502102 | 9/2002 | |
| TW | 510490 | 11/2002 | F28D 15/02 |
| TW | 516810 | 1/2003 | |
| WO | WO 01/25711 A1 | 4/2001 | F28F 3/04 |
| WO | 02081996 A2 | 10/2002 | |
| WO | WO 2004/036040 A1 | 4/2004 | F04B 17/00 |

(56) References Cited

FOREIGN PATENT DOCUMENTS

| WO | WO 2004/076857 A3 | 9/2004 | ............. F04B 37/02 |
|----|---|---|---|
| WO | 2005080901 A1 | 9/2005 | |
| WO | 2007006590 A2 | 1/2007 | |

OTHER PUBLICATIONS

Kendra V. Sharp et al., "Liquid Flows in Microchannels", 2002, vol. 6, pp. 6-1 to 6-38, 0-8493-0077, copyright 2002 by CRC Press LLC.

Shuchi Shoji et al., "Microflow devices and systems", J. Micromech. Microeng. 4 (1994), pp. 157-171, printed in the U.K Mechatronics and Precision Engineering, Tohoko University, Aza Aoba, Aramaki, Aoba-ku Sendai 980, Japan Department of Electronic and Communication Engineering, School of Science and Engineering, Waseda University, 3-4-1 Ohkubo, Shinjuko-ko, Tokyo 169, Japan.

Angela Rasmussen et al., "Fabrication Techniques to Realize CMOS-Compatible Microfluidic Microchannels", Journal of Microelectromechanical Systems, vol. 10, No. 2, Jun. 2001, pp. 286-297, Department of Electrical and Computer Engineering, The George Washington University, Washington, D.C. 1057-7157101.

J. H. Wang et al. "Thermal-Hydraulic Characteristic of Micro Heat Exchangers" 1991, DSC—vol. 32, Micromechanical Sensors Actuators, and Systems, pp. 331-339, Energy Resources Laboratories, Industrial Technology Research Institute Hsinchu, Taiwan, Republic of China.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23, 1521-3331/copyright 2001IEEE.

X. F. Peng et al., "Heat Transfer Characteristics of Water Flowing Through Microchannels" Experimental Heat Transfer vol. 7, Nov. 4,1994, pp. 265-283, Department of Mechanical Engineering,Texas A&M University, College Station, Texas USA 0891-6152/94.

Linan Jiang et al., "Forced Convection Boiling in a Microchannel Heat Sink", Journal of Microelectromechanical Systems, vol. 10, No. 1, Mar. 2001, pp. 80-87, Department of Mechanical Engineering, Hong Kong University of Science and Technology, Hong Kong, Publish Item Identifier No. S 1057-7157(01)01598-0.

Muhammad M. Rahman et al., "Experimental Measurements of Fluid Flow and Heat Transfer in Microchannel Cooling Passages in a Chip Substrate", 1993, EEP—vol. 4-2, Advances in Electronic Packaging, pp. 685-692, Thermal Systems Division Mainstream Engineering Corporation, Rockledge, Florida, Thermal Engineering Department, Tsinghua University, Beijing 100084 China.

X. F. Peng et al., "Forced convection and flow boiling heat transfer for liquid flowing through Microchannels", 1993, Int. J. Heat Mass Transfer, vol. 36, No. 14, pp. 3421-3427, Thermal Engineering Department, Tsinghua University, Beijing 100084, China.

Lung-Jieh Yang et al., "A Micro Fluidic System of Micro Channels with On-Site Sensors by Silicon Bulk Micromachining", Sep. 1999, Microfluidic Devices and Systems II, vol. 3877, No. 151, pp. 267-272, Department of Mechanical Engineering, Tamkang University, No. 151, Yih-Chan Rd., Tansui, 25137, Taiwan, Republic of China, 0277-786X/99.

G. Mohiuddin Mala et al. "Heat transfer and fluid flow in microchannels", 1997, Int. J. Heat Mass Transfer, vol. 40, No. 13, pp. 3079-3088, printed in Great Britain Department of Mechanical Engineering, University of Alberta, Edmonton, Alberta, Canada, T6G, 2G8, PII: S0017-9310(96) 00356-0.

J. M. Cuta et al., "Fabrication and Testing of Micro-Channel Heat Exchangers", SPIE vol. 2640, 1995, pp. 152-160, Pacific Northwest Laboratory, Richland, WA 99352, 0-8194-2006-9/95.

Linan Jiang et al., "A Micro-Channel Heat Sink with Integrated Temperature Sensors for Phase Transition Study", IEEE 1999, pp. 159-164., Department of Mechanical Engineering, The Hong Kong University of Science and Technology, Clearwater Bay, Kowloon, Hong Kong.

Linan Jiang et al., "Fabrication and characterization of a microsystem for a micro-scale heat transfer study", J. Micromech. Microeng. 9 (1999) pp. 422-428, printed in the U.K., Hong Kong University of Science and Technology, Hong Kong, PII: S0960-1317(99) 06750-9.

M. B. Bowers et al. "High flux boiling in low flow rate, low pressure drop mini-channel and micro-channel heat sinks" 1994, Int. J. Heat Mass Transfer, vol. 37, No. 2, printed in Great Britain, pp. 321-332, Boiling and Two-Phase Flow Laboratory, School of Mechanical Engineering, Purdue University, West Lafayette, IN 47907, USA 0017-9310-94.

Yogendra Joshi,"Heat out of small packages" Dec. 2001, Mechanical Engineering, pp. 56-58, George W. Woodruff School of Mechanical Engineering, Georgia Institute of Technology.

A. Rostami et al., "Liquid Flow and Heat Transfer in Microchannels: A Review", 2000, Heat and Technology, vol. 18, No. 2, pp. 59-68., Department of Mechanical Engineering, Isfahan University of Technology—Isfahan, Iran.

Lian Zhang et al., "Measurements and Modeling of Two-Phase Flow in Microchannels With Nearly Constant Heat Flux Boundary Conditions", Journal of Microelectromechanical Systems, vol. 1, No. 1, Feb. 2002, pp. 12-19., Publication No. 1057-7157/02.

Muhammad Mustafizur Rahman, "Measurements of Heat Transfer in Microchannel Heat Sinks", Int. Comm. Heat Mass Transfer, vol. 27, No. 4, May 2000, pp. 495-506., Department of Mechanical Engineering, University of Sough Florida, Tampa, FL 33620, PII. S0735-1933(00)132-9.

Issam Mudawar et al., "Enhancement of Critical Heat Flux from High Power Microelectronic Heat Sources in a Flow Channel", Journal of Electronic Packaging, Sep. 1990, vol. 112, pp. 241-248, Purdue University, Boiling and Two-Phase Flow Laboratory, Dept.

Nelson Kuan, "Experimental Evaluation of Micro Heat Exchangers Fabricated in Silicon", 1996, HTD—vol. 331, National Heat Transfer Conference, vol. 9, pp. 131-136., Department of Mechanical Engineering and Applied Mechanics, University of Pennsylvania, Philadelphia, Pennsylvania.

E. W. Kreutz et al. "Simulation of micro-channel heat sinks for optoelectronic microsystems", Microelectronics Journal 31(2000), pp. 787-790.,Lehrstuhl fur Lasertechnik, Rheinsch-Westfalische, Technische Hochschule Aachen, Steinbachstrabe 15, D-52074 Aache, Germany 0026-2692/00/5.

J. C. Y. Koh et al., "Heat Transfer of Microstructures for Integrated Circuits", 1986, Int. Comm. Heat Mass Transfer, vol. 13, pp. 89-98, Pergamon Press Ltd., 0735-1933/86.

Snezana Konecni et al., "Convection Cooling of Microelectronic Chips", 1992, InterSociety Conference on Thermal Phenomena, pp. 138-144, University of texas at Arlington, Arlington, Texas 76019, CH3096-5192/0000-0138.

Michael B. Kleiner et al., "High Performance Forced Air Cooling Scheme Employing Microchannel Heat Exchangers", Dec. 1995, IEEE Transactions on Components, Packaging, and Manufacturing Technology—Part A, vol. 18, No. 4, pp. 795-804, 1070-9886/95.

Jerry K. Keska Ph. D. et al., "An Experimental Study on an Enhanced Microchannel Heat Sink for Microelectronics Applications", EEP—vol. 26-2, Advances in Electronic Packaging, 1999, vol. 2, pp. 1235-1259., St. Martins College, 3702A Lome St., Tumwater, WA 98501.

Shung-Wen Kang et al., "The Performance Test and Analysis of Silicon-Based Microchannel Heat Sink", Jul. 1999, Terahertz and Gigahertz Photonics, vol. 3795, pp. 259-270, Department of Mechanical Engineering, Tamkang University, Taman, Taipei 25137, Taiwan, ROC 0277-786X199.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102, Department of Mechanical Engineering, University of Alberta, Edmonton, Alta, Canada T6G 2G8 PII: SO927-7757 (99)00328.3.

Jeffery D. Barner et al., "Thermal Ink Jet Print Head Carriage with Integral Liquid Cooling Capabilities", Xerox Disclosure Journal—vol. 21, No. 1, Jan./Feb. 1996, pp. 33-34.

(56) References Cited

OTHER PUBLICATIONS

"Autonomous displacement of a solution in a microchannel by another solution", Research Disclosure, Jun. 2001, pp. 1046-1047.
John M. Waldvogel, "Aluminum Silicon Carbide Phase Change Heat Spreader", Motorola, Jun. 1999, Technical Developments, pp. 226-230.
James P. Slupe et al., "An idea for maintaining a stable thermal environment for electronic devices", Research Disclosure, Aug. 2001, p. 1312, # 448039.
John M. Waldvogel, "A Heat Transfer Enhancement Method for Forced Convection Bonded-Fin Heatsinks", Motorola, Dec. 1997, Technical Developments, pp. 158-159.
"Thin Heat Pipe for Cooling Components on Printed Circuit Boards", IBM Technical Disclosure Bulletin, vol. 34, No. 7B, Dec. 1991, pp. 321-322.
R. C. Chu et al., "Process for Nucleate Boiling Enhancement", IBM Technical Disclosure Bulletin, vol. 18, No. 7, Dec. 1975, p. 2227.
J. Riseman, "Structure for Cooling by Nucleate Boiling", IBM Technical Disclosure Bulletin, vol. 18, No. 11, Apr. 1976, p. 3700.
"Integrally Grooved Semiconductor Chip and Heat Sink", Oct. 1971, IBM Technical Disclosure Bulletin, vol. 14, No. 5, p. 1425.
"Enhanced Cooling of Thermal Conduction Module", IBM Technical Disclosure Bulletin, vol. 30, No. 5, Oct. 1987, p. 426.
"Heat Exchanger Modules for Data Processor with Valves Operated by Pressure from Cooling Water Pump", IBM Technical Disclosure Bulletin, vol. 30, No. 5, Oct. 1987, p. 419.
"Cold Plate for Thermal Conduction Module with Inlet for Cooling Water Near Highest Power Chips", IBM Technical Disclosure Bulletin, vol. 30, No. 5, Oct. 1987, p. 413.
"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.
"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.
"Cooling System for Chip Carrier on Card", IBM Technical Disclosure Bulletin, vol. 31, No. 4, Sep. 1988, pp. 39-40.
"Chip Cooling Device", IBM Technical Disclosure Bulletin, vol. 30, No. 9, Feb. 1988, pp. 435-436.
W. E. Ahearn et al. "Silicon Heat Sink Method to Control Integrated Circuit Chip Operating Temperatures", IBM Technical Disclosure Bulletin, vol. 21, No. 8, Jan. 1979, pp. 3378-3380.
N. P. Bailey et al., "Cooling Device for Controlled Rectifier", IBM Technical Disclosure Bulletin, vol. 21, No. 11, Apr. 1979, pp. 4609-4610.
W. J. Kleinfelder et al., "Liquid-Filled Bellows Heat Sink", IBM Technical Disclosure Bulletin, vol. 21, No. 10, Mar. 1979, pp. 4125-4126.
R. P. Chrisfield et al., "Distributed Power/Thermal Control", IBM Technical Disclosure Bulletin, vol. 22, No. 3, Aug. 1979, pp. 1131-1132.
A. J. Arnold et al., "Heat Sink Design for Cooling Modules in a Forced Air Environment", IBM Technical Disclosure Bulletin, vol. 22, No. 6, Nov. 1979, pp. 2297-2298.
A. J. Arnold, "Structure for the Removal of Heat from an Integrated Circuit Module", IBM Technical Disclosure Bulletin, vol. 22, No. 6, Nov. 1979, pp. 2294-2296.
U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.
K. C. Gallagher et al., "Cooling System for Data Processor with Flow Restricter in Secondary Loop to Limit Bypass-Cooling Water Flow", IBM Technical Disclosure Buelletin, vol. 26, No. 5, Oct. 1983, p. 2658.
R. C. Chu et al., "Silicon Heat Sink for Semiconductor Chip", IBM Technical Disclosure Bulletin, vol. 24, No. 11A, Apr. 1982, p. 5743.
J. M. Eldridge et al., "Heat-Pipe Vapor Cooling Etched Silicon Structure", IBM Technical Disclosure Bulletin, vol. 25, No. 8, Jan. 1983, pp. 4118-4119.
J. R. Skobern, "Thermoelectrically Cooled Module", IBM Technical Disclosure Bulletin, vol. 27, No. 1A, Jun. 1984, p. 30.
M. J. Brady et al., "Etched Silicon Integrated Circuit Heat Sink", IBM Technical Disclosure Bulletin, vol. 27, No. 1B, Jun. 1984, p. 627.
H. D. Edmonds et al., "Heat Exchange Element for Semiconductor Device Cooling", IBM Technical Disclosure Bulletin, vol. 23, No. 3, Aug. 1980, p. 1057.
R. W. Noth, "Heat Transfer from Silicon Chips and Wafers", IBM Technical Disclosure Bulletin, vol. 17, No. 12, May 1975, p. 3544.
"Miniature Heat Exchanger for Corrosive Media", IBM Technical Disclosure Bulletin, vol. 38, No. 01, Jan. 1995, pp. 55-56.
"Self-Contained Active Heat Dissipation Device", IBM Technical Disclosure Bulletin, vol. 39, No. 04, Apr. 1996, pp. 115-116.
C. J. Keller et al, "Jet Cooling Cup for Cooling Semiconductor Devices", IBM Technical Disclosure Bulletin, vol. 20, No. 9, Feb. 1978, pp. 3575-3576.
B. J. Ronkese, "Centerless Ceramic Package with Directly Connected Heat Sink", IBM Technical Disclosure Bulletin, vol. 20, No. 9, Feb. 1978, p. 3577-3578.
K. S. Sachar, "Liquid Jet Cooling of Integrated Circuit Chips", vol. 20, No. 9, Feb. 1978, pp. 3727-3728.
A. H. Johnson, "Device Cooling", IBM Technical Disclosure Bulletin, vol. 20, No. 10, Mar. 1978, pp. 3919-3920.
R. D. Durand et al., "Flexible Thermal Conductor for Electronic Module", IBM Technical Disclosure Bulletin, vol. 20, No. 11A, Apr. 1978, p. 4343.
D. Balderes et al., "Liquid Cooling of a Multichip Module Package", IBM Technical Disclosure Bulletin, vol. 20, No. 11A, Apr. 1978, pp. 4336-4337.
J. A. Dorler et al., "Temperature Triggerable Fluid Coupling System for Cooling Semiconductor Dies", IBM Technical Disclosure Bulletin, vol. 20, No. 11A, Apr. 1978, pp. 4386-4388.
V. W. Antonetti et al., "Integrated Module Heat Exchanger", IBM Technical Disclosure Bulletin, vol. 20, No. 11A, Apr. 1978, p. 4498.
P. Hwang et al., "Conduction Cooling Module", IBM Technical Disclosure Bulletin, vol. 20, No. 11A, Apr. 1978, pp. 4334-4335.
A. J. Arnold et al., "Electronic Packaging Structure", IBM Technical Disclosure Bulletin, vol. 20, No. 11B, Apr. 1978, pp. 4820-4822.
V. Y. Doo et al., "High Performance Package for Memory", IBM Technical Disclosure Bulletin, vol. 21, No. 2, Jul. 1978, pp. 585-586.
"Multi-Chip Package with Cooling by, a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.
J. Landrock et al., "Cooling System for Semiconductor Chips", IBM Technical Disclosure Bulletin, vol. 23, No. 4, Sep. 1980, p. 1483.
E. P. Damm, Jr., "Convection Cooling Apparatus", IBM Technical Disclosure Bulletin, vol. 20, No. 7, Dec. 1977, pp. 2755-2756.
"Circuit Package with Circulating Boiling Liquid and Local Heat Exchanger to Limit Vapor in Coolant Outlet", IBM Technical Disclosure Bulletin, vol. 31, No. 12, May 1989, p. 34.
"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.
"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.
"Water-Cooled Circuit Module with Grooves Forming Water Passages Near Heat-Producing Devices", IBM Technical Disclosure Bulletin, vol. 31, No. 12, May 1989, pp. 49-50.
"Cold Plate for Thermal Conduction Module with Only Peripheral Mounting Bolts Large Surface Area Fin Inserts and Reduced Water Flow and Thermal Resistances", IBM Technical Disclosure Bulletin, vol. 31, No. 12, May 1989, p. 59.
"Thermal Control Hardware for Accelerated Run-In Testing of Multi-Chip Modules", IBM Technical Disclosure Bulletin, vol. 32, No. 5A, Oct. 1989, p. 129-130.
"Means of Removing More Heat From a TCM (or Other Liquid-Cooled Logic Package) by Reducing the Coolant Temperature", IBM Technical Disclosure Bulletin, vol. 32, No. 5A, Oct. 1989, pp. 153-154.

(56) References Cited

OTHER PUBLICATIONS

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., "Semiconductor Chip Cooling Package", IBM Technical Disclosure Bulletin, vol. 20, No. 4, Sep. 1977, pp. 1440-1441.

"Heat Sink Fabrication Method", IBM Technical Disclosure Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, pp. 362-367, Mechanical Aerospace and Nuclear Engineering Department, University of California at Los Angeles, Los Angeles, CA 90024 USA.

Jaisree Moorthy et al., "Active control of electroosmotic flow in microchannels using light", Jan. 26, 2001, Sensors and Actuators B 75, pp. 223-229, Beckman Institute for Advanced Science and Technology, N. Matthews Ave., Urbana, IL 61801 USA, Department of BioMedical Engineering, 1410 Engineering Dr., Madison, WI 53703 USA PII S0925-4005(01)00557-3.

Andreas Manz et al., "Electroosmotic pumping and electrophoretic separations for miniaturized chemical analysis systems", Sep. 16, 1994, J.Micromech. Microeng. 4, pp. 257-265, printed in the U.K., Ciba-Geigy Ltd., Corporate Analytical Research, CH 4002 Basel, Switzerland 0960-1317/94/040257.

E. B. Cummings et al., "Irrotationality of Uniform Electroosmosis", Sep. 1999, Part of the SPIE Conference on Microfluidic Devices and Systems II, SPIE vol. 3877, pp. 180-189, Sandia National Laboratories, P.O. Box 969, Livermore, CA USA, 0277-786X 199.

Haim H. Bau, "Optimization of conduits' shape in micro heat exchangers", International Journal of Heat and Mass Transfer 41 (1998), pp. 2717-2723, Dec. 10, 1997,Department of Mechanical Engineering and Applied Mechanics, University of Pennsylvania, Philadelphia, PA 19104-6315 USA PII: S0617 9310(98)00003-9.

V. K. Dwivedi et al., "Fabrication of very smooth walls and bottoms of silicon microchannels for heat dissipation of semiconductor devices", Jan. 25, 2000, Microelectronics Journal 31, pp. 405-410, Central Electronics Engineering Research Institute, Pilani, Rajasythan 333031, India PII S6026-2692(00) 00015-X.

M. B. Bowers et al.,"Two-Phase Electronic Cooling Using Mini-Channel and Micro-Channel Heat Sinks: Part 2—Flow Rate and Pressure Drop Constraints", Dec. 1994, Journal of Electronic Packaging, vol. 116, pp. 298-305, Electronic Cooling Research center, Boiling and Two-Phase Flow Laboratory, School of Mechanical Engineering, Purdue University, West Lafayette, IN 47907.

Meint J. de Boer et al., "Micromachining of Buried Micro Channels in Silicon", Mar. 2000, Journal of Microelectromechanical Systems, Journal of Microelectromechanical Systems, vol. 9, No. 1, pp. 94-103.

S.B. Choi et al., "Fluid Flow and Heat Transfer in Microtubes", DSC—vol. 32, Micromechanical Sensors, Actuators, and Systems, ASME 1991, pp. 123-134, Department and Mechnaical and Industrial Engineering, Louisana Technical University, Ruston, Louisiana.

S. F. Choquette, M. Faghri et al., "Optimum Design of Microchannel Heat Sinks", DSC—vol. 59, Microelectromechanical Systems (MEMS), ASME 1996, pp. 115-126, Department of Mechanical Engineering, University of Rhode Island 02881.

David Copeland et al. "Manifold Microchannel Heat Sinks: Theory and Experiment", EEP—vol. 10-2 Advances in Electronic Packaging, ASME 1995, pp. 829-835, Department of Mechanical and Intelligent Systems Engineering, Tokyo Japan.

J. M. Cuta et al., "Forced Convection Heat Transfer in Parallel Channel Array Microchannel Heat Exchanger", PID—vol. 2 / HTD—vol. 338, Advances in Energy Efficiency, Heat/Mass Transfer Enhancement, ASME 1996, pp. 17-23, Environmental Division, Pacific Northwest National Laboratory, Richland, WA.

K. Fushinobu et al., "Heat Generation and Transport in Sub-Micron Semiconductor Devices", HTD—vol. 253, Heat Transfer on the Microscale, ASME 1993, pp. 21-28. Department of Mechanical and Environmental Engineering, University of California, Santa Barbara, CA.

Charlotte Gillot et al. "Integrated Micro Heat Sink for Power Multichip Module", IEEE Transactions on Industry Applications, vol. 36, No. 1, Jan./Feb. 2000, pp. 217-221.

John Goodling, "Microchannel heat exchangers—a review", SPIE vol. 1997, Publication date Nov. 1993, pp. 66-82, High Heat Flux Engineering II, Ali M. Khounsary;Ed. (Spie Homepage), Auburn University, Mechanical Engineering, Ross Hall, Auburn, Alabama36849.

Koichiro Kawano et al., "Micro Channel Heat Exhanger for Cooling Electrical Equipment", HTD—vol. 361-3/PID—vol. 3, Proceedings of the ASME Heat Transfer Division—vol. 3, ASME 1998, pp. 173-188, Energy and Mechanical Laboratory Research and Development Center, Toshiba Corporation.

Chad Harris et al., "Design and Fabrication of a Cross Flow Micro Heat Exchanger", Dec. 2000, Journal of Microelectromechanical Systems, vol. 9, No. 4, pp. 502-508.

George M. Harpole et al., "Micro-Channel Heat Exchanger Optimization", Feb. 1991, Seventh IEEE Semi-Therm Symposium, pp. 59-63, Seventh Annual IEEE.

Pei-Xue Jiang et al., "Thermal-hydraulic performance of small scale micro-channel and porous-media heat-exchangers", International Journal of Heat and Mass Transfer 44 (2001), Feb. 21, 2000, pp. 1039-1051, Department of Thermal Engineering, Tsinghua University, Beijing 100084 PRC.

X.N. Jiang et al., "Laminar Flow Through Microchannels Used for Microscale Cooling Systems", Oct. 1997, IEEE/CPMT Electronic Packaging Technology Conference, pp. 119-122, School of Mechanical and Production Engineering, Nanyang Technological University.

David Bazeley Tuckerman, "Heat-Transfer Microstructures for Integrated Circuits", Feb. 1984, pp. ii-xix, pp. 1-141, Stanford Unversity.

M Esashi, "Silicon micromachining for integrated microsystems", Vacuum/vol. 47/No. 6, Jun. 1996, pp. 469-474.

T.S. Ravigururajan et al., "Effects of Heat Flux on Two-Phase Flow Characteristics of Refrigerant Flows in a Micro-Channel Heat Exchanger", American Society of Mechanical Engineers, Heat Transfer Division HTD—vol. 329, National Heat Transfer Conference, vol. 7, ASME 1996, pp. 167-178.

T.S. Ravigururajan et al., "Single-Phase Flow Thermal Performance Characteristics of a Parallel Micro-Channel Heat Exchanger", HTD—vol. 329, National Heat Transfer Conference, vol. 7, ASME 1996, pp. 157-166, Department of Mechanical Engineering, Wichita State University, Wichita, Kansas, 67260.

T.S. Ravigururajan et al. "Liquid Flow Characteristics in a Diamond-Pattern Micro-Heat-Exchanger", DSC—vol. 59 Microelectromechanical Systems (MEMS), ASME 1996, pp. 159-166., Department of Mechanical Engineering, Wichita State University, Wichita Kansas, 67260.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491, Department of Mechanical Engineering, Wichita State University, Wichita Kansas, 67260.

J. Pfahler et al., "Liquid Transport in Micron and Submicron Channels", Sensors and Actuators, A21-A23 (1990), Publication date Nov. 1989, printed in Netherlands, pp. 431-434.

Kenneth Pettigrew et al., "Performance of a MEMS based Micro Capillary Pumped Loop for Chip-Level Temperature Control", Publication date Aug. 7, 2002, pp. 427-430, Berkeley Sensor and Actuator Center, University of California, Berkeley, CA.

C. Perret et al., "Microchannel integrated heat sinks in silicon technology", Publication date Oct. 15, 2008, pp. 1051-1055, Laboratoire d' Electrotechnique de Grenoble INPG/UJF.

(56) References Cited

OTHER PUBLICATIONS

X.F. Peng et al., "Convective heat transfer and flow friction for water flow in microchannel structures", Int. J. Heat Mass Transfer, vol. 39, No. 12, pp. 2599-2608, copyright 1996, printed in Great Britain.

X.F. Peng et al. "Experimental investigation of heat transfer in flat plates with rectangular microchannels", Int. J. Heat Mass Transfer, vol. 38, No. 1, pp. 127-137, copyright 1994, printed in Great Britain.

X.F. Peng et al., "Cooling Characteristics with Microchanneled Structures", 1994, Enhanced Heat Transfer, vol. 1, No. 4, pp. 315-326, copyright 1994 Gordon and Breach Science Publishers, printed in the USA.

X.F. Peng et al., "Enhancing the Critical Heat Flux Using Microchanneled Surfaces", 1998, Enhanced Heat Transfer, vol. 5, pp. 165-176, 1998 Overseas Publisheres Assoc., Printed in India.

Yoichi Murakami et al., "Parametric Optimization of Multichanneled Heat Sinks for VLSI Chip Cooling", Publication date: Mar. 2001, IEEE Transactions on Components and Packaging Technologies, vol. 24, No. 1, pp. 2-9.

D. Mundinger et al., "High average power 2-D laser diode arrays on silicon microchannel coolers", CLEO '89/Friday Morning/404.

L. J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M. J. Marongiu et al., "Enhancement of Multichip Modules (MCMs) Cooling by Incorporating MicroHeatPipes and Other High Thermal Conductivity Materials into Microchannel Heat Sinks", Publication date Apr. 17, 1998, Electronic Components and Technology Conference, pp. 45-50.

C. R. Friedrich et al., "Micro heat exchangers fabricated by diamond machining", Precision Engineering, Jan. 1994, vol. 16, No. 1, pp. 56-59, Institute of Micro Manufacturing, Louisiana Tech University.

Mali Mahalingam, "Thermal Management in Semiconductor Device Packaging", Proceedings of the IEEE, vol. 73, No. 9, Sep. 1985, pp. 1396-1404.

T. M. Adams et al., "An experimental investigation of single-phase forced convection in microchannels", copyright 1997, Elsevier Science Ltd., pp. 851-857, George Woodruff School of Mechanical Engineering, Printed in Great Britain, PII: S0017-9310(97)00180-4.

T. M. Adams et al., "Applicability of traditional turbulent single-phase forced convection correlations to non-circular microchannels", Int. J. of Heat and Mass Transfer 42 (1999), revised Mar. 19, 2009, pp. 4410-4415, George Woodruff School of Mechanical Engineering.

Bassam Badran et al., "Experimental Results for Low-Temperature Silicon Micromachined Micro Heat Pipe Arrays Using Water and Methanol as Working Fluids", May 31, 1997, Experimental Heat Transfer, vol. 10: pp. 253-272.

D. Jed Harrison et al. "Electroosmotic Pumping Within a Chemical Sensor System Integrated on Silicon", Jun. 26, 1991, pp. 792-795, paper appears s in Solid State Sensors and Actuators 1991.

Kurt Seiler et al., "Electroosmotic Pumping and Valveless Control of Fluid Flow within a Manifold of Capillaries on a Glass Chip", Analytical Chemistry, vol. 66, No. 20, Oct. 15, 1994, pp. 3485-3491.

Philip H. Paul et al., "Electrokinetic Generation of High Pressures Using Porous Microstructures",Third International Symposium on Micro-Total Analysis, held on Oct. 13-16, 1998, Banff, Alberta, Canada, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W. E. Morf et al., "Partial electroosmotic pumping in complex capillary systems Part 1: Principles and general theoretical approach", Sensors and Actuators B 72, Feb. 2, 2001, pp. 266-272.

M. Esashi, "Silicon micromachining and micromachines", ISSN 0043-1648, Elsevier Science, Lauusanne, Swisse, (1958), Wear 168, (1993) pp. 181-187.

Stephanus Buttgenbach et al., "Microflow devices for miniaturized chemical analysis systems", Nov. 1998, SPIE—Conference on Chemical Microsensors and Applications, Institute for Microtechnology, Technical University of Braunschweig, Germany, vol. 3539, pp. 51-61.

Linan Jiang et al., "Closed-Loop Electroosmotic Microchannel Cooling System for VLSI Circuits", Mechanical Engineering Dept. of Stanford University, paper appears in Components and Packaging Technologies, IEEE Transactions, Publication date Jan. 6, 2003, vol. 25, Issue 3, pp. 1-27.

Susan L. R. Barker et al., "Fabrication, Derivatization and Applications of Plastic Microfluidic Devices", Proceedings of SPIE, vol. 4205, 2001, DOI:10.1117/12.417.439, online publication date :May 2, 2003.

Timothy E. McKnight et al., "Electroosmotically Induced Hydraulic Pumping with Integrated Electrodes on Microfluidic Devices", Publication date, Jul. 10, 2001, Anal. Chem., vol. 73, No. 16, pp. 4045-4049, copyright 2001, American Chemical Society.

Chris Bourne, "Cool Chips plc Receives Nanotech Manufacturing Patent", Jul. 31, 2002, pp. 1-2, www.coolchips.gi/press/pr_020731.shtml.

Frank Wagner et al., "Electroosmotic Flow Control in Micro Channels Produced by Scanning Excimer Laser Ablation", Proceedings of SPIE vol. 4088, 2000, First International Symposium on Laser Precision Microfabrication, Isamu Miyamoto et al., editors.

H. A. Goodman, "Data Processor Coolinith Connection to Maintain Flow Through Standby Pump", Dec. 1983, IBM Technical Disclosure Bulletin, IBM Corp. 1983, vol. I 26, No. 7A, p. 3325.

"Electroerosion Micropump", May 1990, IBM Technical Disclosure Bulletin, IBM Corp 1990, vol. 32, No. 12, pp. 342-343.

Shulin Zeng et al.,"Fabrication and Characterization of Electrokinetic Micro Pumps", 2000 Inter Society Conference on Thermal Phenomena, Department of Mechanical Engineering, Stanford University, Stanford, CA., Current Version Published, Aug. 6, 2002, pp. 31-35.

A. Manz et al., "Integrated Electroosmotic Pumps and Flow Manifolds for Totalchemical Analysis Systems", 1991, Inter. Conf. on Solid-State Sensors and Actuators, Current Version Published Aug. 6, 2002, pp. 939-941.

O. T. Guenat et al., "Partial electroosmotic pumping in complex capillary systems Part: 2 Fabrication and application of a micro total analysis system (µTAS) suited for continuous volumetric nanotitrations", Sensors and Actuators B 72 (2001) pp. 273-282, Sensors, Actuators and Microsystems Laboratory, Institute of Microtechnology, University of Neuchatel.

J. G. Sunderland, "Electrokinetic dewatering and thickening. I. Introduction and historical review of electrokinetic applications" Publication date, Feb. 4, 1987, Journal of Applied Electrochemistry, vol. 17, pp. 889-898, The Electricity Council Research Centre, Capenhurst, Chester, UK.

J. C. Rife et al., "Acousto- and electroosmotic microfluidic controllers", Sep. 1998, Microfluidic Devices and Systems, SPIE vol. 3515, pp. 125-135, online publication date Mar. 8, 2004.

Purnendu K. Dasgupta et al., "Electroosmosis: A Reliable Fluid Propulsion System for Flow Injection Analysis", Publication date,Jun. 7, 1994, Anal. Chem., vol. 66, No. 11, pp. 1792-1798, Department of Chemistry and Biochemistry, Texas Tech University, Texas.

Ray Beach et al., "Modular Microchannel Cooled Heatsinks for High Average Power Laser Diode Arrays", Published Aug. 6, 2002, IEEE Journal of Quantum Electronics, vol. 28, No. 4, pp. 966-976, Quantum Electronics, IEEE Journal.

Roy W. Knight et al. "Optimal Thermal Design of Air Cooled Forced Convection Finned Heat Sinks—Experimental Verification", Published Oct. 1992, IEEE Transactions on Components, Hybrids, and Manufacturing Technology, vol. 15, No. 5, pp. 754-760.

Y. Zhuang et al., "Experimental study on local heat transfer with liquid impingement flow in two-dimensional micro-channels", Feb. 9, 1997, Int. J. Heat Mass Transfer, vol. 40, No. 17, printed in Great Britain, pp. 4055-4059, Department of Thermal Science and Engineering, Beijing, China, PII: S0017-9310(97)000J9-2.

(56) References Cited

OTHER PUBLICATIONS

D. Yu et al., "An Experimental and Theoretical Investigation of Fluid Flow and Heat Transfer in Microtubes", 1995, ASME / JSME Thermal Engineering Conference, vol. 1, pp. 523-530, Institute for Micromanufacturing, Louisiana Tech University, Louisiana.

Xiaoqing Yin et al., "Micro Heat Exchangers Consisting of Pin Arrays", Journal of Electronic Packaging, Mar. 1997, vol. 119, Issue 1, pp. 51-57, Revised Oct. 5, 1996.

X. Yin et al., "Uniform Channel Micro Heat Exchangers", Journal of Electronic Packaging, published Sep. 6, 1995, vol. 119, pp. 89-94, Department of Mechanical Engineering and Applied Mechanics, University of PA.

Chun Yang et al., "Modeling forced liquid convection in rectangular microchannels with electrokinetic effects", International Journal of Heat and Mass Transfer 41, final form,Mar. 18, 1998, pp. 4229-4249.

Arel Weisberg et al., "Analysis of microchannels for integrated cooling",1992, Int. J. Heat Mass Transfer, vol. 35, No. 10, printed in Great Britain, pp. 2465-2474, ISSN 0017-9310.

Roger S. Stanley et al., "Two-Phase Flow in Microchannels", 1997, DSC—vol. 62/HTD—vol. 354, MEMS, pp. 143-152, Published by Elsevier Science, Inc., available online May 28, 2002.

B. X. Wang et al., "Experimental investigation on liquid forced-convection heat transfer through microchannelst", 1994, Int. J. Heat Mass Transfer, vol. 37, Suppl. 1, pp. 73-82, copyright 1994 Elsevier Science Ltd., printed in Great Britain.

Kambiz Vafai et al., "Analysis of two-layered micro-channel heat sink concept in electronic cooling", Int. J. of Heat and Mass Transfer 42 (1999), vol. 42, pp. 2287-2297(9 ref), Mechanical Engineering Department, The Ohio State University, Columbus, OH 43210, ISSN 0017-9310.

Gokturk Tunc et al., "Heat transfer in rectangular microchannels", Int. J. of Heat and Mass Transfer 45 (2002), pp. 766-773, Copyright 2001, Published by Elsevier Science Ltd., Available online Nov. 3, 2001.

D. B. Tuckerman et al., "High-Performance Heat Sinking for VLSI", Publication date May 1981, IEEE Electron Device Letters, vol. 2, Issue 5, pp. 126-129, current version published Aug. 9, 2005.

Bengt Sunden et al., "An Overview of Fabrication Methods and Fluid Flow and Heat Transfer Characteristics of Micro Channels", pp. 3-23, Division of Heat Transfer, Lund Sweden.

David S. Shen et al., "Micro Heat Spreader Enhanced Heat Transfer in MCMs", Multi-Chip Module Conference, 1995 MCMC-, pp. 189-194, Publication date, Feb. 2, 1995, current version published Aug. 6, 2002.

S. Sasaki et al. "Optimal Structure for Microgrooved Cooling Fin for High-Power LSI Devices", Electronic Letters, Publication date Dec. 4, 1986, vol. 22, No. 25 pp. 1332-1334, current version published Jul. 11, 2007.

Vijay K. Samalam, "Convective Heat transfer in Microchannels", Revised May 25, 1989, vol. 18, No. 5, pp. 611-617, Journal of Electronic Materials, Publisher Springer Boston.

Sanjay K. Roy et al., "A Very High Heat Flux Microchannel Heat Exchanger for Cooling of Semiconductor Laser Diode Arrays", Published May 1996, IEEE Transactions on Components, Packaging, and Manufacturing Technology—Part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Publication date Sep. 1999, pp. 384-389, current version published Aug. 6, 2002.

A.L. Pascuzzo et al. "Integrated Circuit Module Package Cooling Structure", IBM Technical Disclosure Bulletin, vol. 20, No. 10, Mar. 1978, pp. 3898-3899, IBM Corp 1978.

H. Krumm, "Chip Cooling", IBM Technical Disclosure Bulletin, vol. 20, No. 7, Dec. 1977, p. 2728, IBM Corp 1977.

Jae-Mo Koo et al., "Modeling of Two-Phase Microchannel Heat Sinks for VLSI Chips", Micro Electro Mechanical Systems, 2001, Publication date 2001, pp. 422-426, Current version published Aug. 7, 2002.

Stephen C. Jacobson et al., "Fused Quartz Substrates for Microchip Electrophoresis", Analytical Chemistry, vol. 67, No. 13, Jul. 1, 1995, pp. 2059-2063.

Kendra V. Sharp et al., "Liquid Flows in Microchannels", 2002, vol. 6, pp. 6-1 to 6-38.

Shuchi Shoji et al., "Microflow devices and systems", J. Micromech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical Systems, vol. 10, No. 2, Jun. 2001, pp. 286-297.

J. H. Wang et al., "Thermal-Hydraulic Characteristic of Micro Heat Exchangers", 1991, DSC—vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing Through Microchannels", Experimental Heat Transfer, vol. 7, Nov. 4, 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP—vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, No. 151, pp. 267-272.

G. Mohiuddin Mala et al., "Heat transfer and fluid flow in microchannels", 1997, Int. J. Heat Mass Transfer, vol. 40, No. 13, pp. 3079-3088, printed in Great Britain.

J. M. Cuta et al., "Fabrication and Testing of Micro-Channel Heat Exchangers", SPIE vol. 2640, 1995, pp. 152-160.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Browers et al., "High flux boiling in low flow rate, low pressure drop mini-channel and micro-channel heat sinks", 1994, Int. J. Heat Mass Transfer, vol. 37, No. 2, printed in Great Britain, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels With Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD—vol. 331, National Heat Transfer Conference, vol. 9, pp. 131-136.

E. W. Kreutz et al., "Simulation of micro-channel heat sinks for optoelectronic microsystems", Microelectronics Journal 31(2000), pp. 787-790.

(56) References Cited

OTHER PUBLICATIONS

J. C. Y. Koh et al., "Heat Transfer of Microstructures for Integrated Circuits", 1986, Int. Comm. Heat Mass Transfer, vol. 13, pp. 89-98.
Snezana Konecni et al., "Convection Cooling of Microelectronic Chips", 1992, InterSociety Conference on Thermal Phenomena, pp. 138-144.
Michael B. Kleiner et al., "High Performance Forced Air Cooling Scheme Employing Microchannel Heat Exchangers", Dec. 1995, IEEE Transactions on Components, Packaging, and Manufacturing Technology—Part A, vol. 18, No. 4, pp. 795-804.
Jerry K. Keska Ph. D. et al., "An Experimental Study on an Enhanced Microchannel Heat Sink for Microelectronics Applications", EEP—vol. 26-2, Advances in Electronic Pacakging, 1999, vol. 2, pp. 1235-1259.
Shung-Wen Kang et al., "The Performance Test and Analysis of Silicon-Based Microchannel Heat Sink", Jul. 1999, Terahertz and Gigahertz Photonics, vol. 3795, pp. 259-270.
Sarah Arulanandam et al., "Liquid transport in rectangular microchannels by electroosmotic pumping", Colloids and Surfaces A: Physicochemical and Engineering Aspects 161 (2000), pp. 89-102.
James P. Slupe et al., "An idea for maintaining a stable thermal environment for electronic devices", Research Disclosure, Aug. 2001, p. 1312.
W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.
K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.
"Forced Boiling Cooling System with Jet Enhancement for Critical Heat Flux Extension", IBM Technical Disclosure Bulletin, vol. 39, No. 10, Oct. 1996, p. 143.
C. J. Keller et al., "Jet Cooling Cup for Cooling Semiconductor Devices", IBM Technical Disclosure Bulletin, vol. 20, No. 9, Feb. 1978, pp. 3575-3576.
"Multi-Chip Package with Cooling by a Spreader Plate in Contact with a Chip having Cylindrical Holes Mating with an Inverse Frame Providing Water How Within its Pins", IBM Technical Disclosure Bulletin, vol. 31, No. 5, Oct. 1988, pp. 141-142.
J. Landrock et al., "Cooling System for Semiconductor Chips", IBM Technical Disclosure Bulletin, vol. 23, No. 4, Sep. 1980, p. 148.
E. P. Damns, Jr., "Convection Cooling Apparatus", IBM Technical Disclosure Bulletin, vol. 20, No. 7, Dec. 1977, pp. 2755-2756.
"Circuit Package with Circulating Boiling Liquid and Local Heat Exchanger to Limit Vapor in Coolant Outlet", IBM Disclosure Bulletin, vol. 31, No. 12, May 1989, p. 34.
"TCM-Like Circuit Module with Local Heat Sink Resting on Chip and Chip Separated From Coolant hy Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.
"Cold Plate for Thermal Conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.
Youngcheol Joo et al., "Fabrication of Monolithic Microchannels for IC Chip Cooling", 1995, pp. 362-367.
Jaisree Moorthy et al., "Active control of electroosmotic flow in microchannels using light", Jan. 26, 2001, Sensors and Actuators B 75, pp. 223-229.
Andreas Manz et al., "Electroosmotic pumping and electrophoretic separations for miniaturized chemical analysis systems", Sep. 16, 1994, J.Micromech. Microeng. 4, pp. 257-265, printed in the U.K.
E. B. Cummings et al., "Irrotationality of uniform electroosmosis", Sep. 1999, Part of the SPIE Conference on Microfluidic Devices and Systems II, SPIE vol. 3877, pp. 180-189.

Haim H. Bau, "Optimization of conduits' shape in micro heat exchangers", International Journal of Heat and Mass Transfer 41 (1998), pp. 2717-2723.
V. K. Dwivedi et al., "Fabrication of very smooth walls and bottoms of silicon microchannels for heat dissipation of semiconductor devices", Jan. 25, 2000, Microelectronics Journal 31, pp. 405-410.
M. B. Bowers et al.,"Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.
Meint J. de Boer et al., "Micromachining of Buried Micro Channels in Silicon", Mar. 2000, Journal of Microelectromechanical Systems, vol. 9, No. 1, pp. 94-103.
S.B. Choi et al., "Fluid Flow and Heat Transfer in Microtubes", DSC—vol. 32, Micromechanical Sensors, Actuators, and Systems, ASME 1991, pp. 123-134.
S. F. Choquette, M. Faghri et al., "Optimum Design of Microchannel Heat Sinks", DSC—vol. 59, Microelectromechanical Systems (MEMS), ASME 1996, pp. 115-126.
David Copeland et al., "Manifold Microchannel Heat Sinks: Theory and Experiment", EEP—vol. 10-2, Advances in Electronic Packaging, ASME 1995, pp. 829-835.
J. M. Cuta et al., "Forced Convection Heat Transfer in Parallel Channel Array Microchannel Heat Exchanger", PID—vol. 2 / HTD—vol. 338, Advances in Energy Efficiency, Heat/Mass Transfer Enhancement, ASME 1996, pp. 17-23.
Fushinobu et al., "Heat Generation and Transport in Sub-Micron Semiconductor Devices", HTD—vol. 253, Heat Transfer on the Microscale, ASME 1993, pp. 21-28.
John Goodling, "Microchannel heat xchangers—a review", SPIE vol. 1997 High Heat Flux Engineering II (1993), pp. 66-82.
Koichiro Kawano et al., "Micro Channel Heat Exhanger for Cooling Electrical Equipment", HTD—vol. 361-3/PID—vol. 3, Proceedings of the ASME Heat Transfer Division—vol. 3, ASME 1998, pp. 173-188.
George M. Harpole et al., "Micro-Channel Heat Exchanger Optimization", 1991, Seventh IEEE Semi-Therm Symposium, pp. 59-63.
Pe-Xue Jiang et al., "Thermal-hydraulic performance of small scale micro-channel and porous-media heat-exchangers", International Journal of Heat and Mass Transfer 44 (2001), pp. 1039-1951.
X.N. Jiang et al. "Laminar Flow Through Microchannels Used for Microscale Cooling Systems", 1997, IEEE/CPMT Electronic Packaging Technology Conference, pp. 119-122.
David Bazeley Tuckerman, "Heat-Transfer Microstructures for Integrated Circuits", Feb. 1984, pp. ii-xix, pp. 1-141.
M Esashi, "Silicon micromachining for integrated microsystems", Vacuum/vol. 47/Nos. 6-8/1996, pp. 469-474.
T.S. Ravigururajan et al. "Effects of Heat Fluxon Two-Phase Flow Characteristics of Refrigerant Flows in a Micro-Channel Heat Exchanger", HTD—vol. 329, Natonal Heat Transfer Conference, vol. 7, ASME 1996, pp. 167-178.
T.S. Ravigururajan et al., "Single-Phase Flow Thermal Performance Characteristics of a Parallel Micro-Channel Heat Exchanger", HTD—vol. 329, National Heat Transfer Conference, vol. 7, ASME 1996, pp. 157-166.
T.S. Ravigururajan et al. "Liquid Flow Characteristics in a Diamond-Pattern Micro-Heat-Exchanger", DSC—vol. 59 Microelectromechanical Systems (MEMS), ASME 1996, pp. 159-166.
T.S. Ravigurumjan, "Impact of Channel Geometry on Two-Phase Flow Heat Transfer Characteristics of Refrigerants in Microchannel Heat Exchangers", May 1998, Journal of Heat Transfer, vol. 120, pp. 485-491.
J. Pfahler et al., "Liquid Transport in Micron and Submicron Channels", Sensors and Actuators, A21-A23 (1990), printed in Netherlands, pp. 431-434.
Kenneth Pettigrew et al., "Performance of a MEMS based Micro Capillary Pumped Loop for Chip-Level Temperature Control", 2001, pp. 427-430.
C. Perret et al., "Microchannel integrated heat sinks in silicon technology", The 1998 IEEE, pp. 1051-1055.

(56) References Cited

OTHER PUBLICATIONS

X.F. Peng et al., "Convective heat transfer and flow friction for water flow in microchannel structures", 1996, Int. J. Heat Mass Transfer, vol. 39, No. 12, pp. 2599-2608, printed in Great Britain.
X.F. Peng et al., "Experimental investigation of heat transfer in flat plates with rectangular microchannels", 1995, Int. J. Heat Mass Transfer, vol. 38, No. 1, pp. 127-137, printed in Great Britain.
X.F. Peng et al., "Cooling Characteristics with Microchanneled Structures", 1994, Enhanced Heat Transfer, vol. 1, No. 4, pp. 315-326, printed in the United States of America.
X.F. Peng et al., "Enhancing the Critical Heat Flux Using Microchanneled Surfaces", 1998, Enhanced Heat Transfer, vol. 5, pp. 165-176, Printed in India.
Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.
L. J. Missiggia et al., "Microchannel Heat Sinks for Two-Dimensional High-Power Density Diode Laser Arrays", IEEE Journal of Quantum Electronics, vol. 25, No. 9, Sep. 1989, pp. 1988-1992.
M. J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.
C. R. Friedrich et al., "Micro heat exchangers fabricated by diamond machining", Jan. 1994, Precision Engineering, vol. 16, No. 1, pp. 56-59.
T. M. Adams et al., "An experimental investigation of single-phase forced convection in microchannels", 1998, Int. J. Heat Mass Transfer, vol. 41, Nos. 6-7, pp. 851-857, Printed in Great Britain.
T. M. Adams et al., "Applicability of traditional turbulent single-phase forced convection correlations to non-circular microchannels", Int. J. of Heat and Mass Transfer 42 (1999), pp. 4411-4415.
D. Jed Harrison et al., "Electroosmotic Pumping Within a Chemical Sensor System Integrated on Silicon", Jun. 26, 1991, pp. 792-795.
Philip H. Paul et al., "Electrokinetic Generation of High Pressures Using Porous Microstructures", Canada 1998, Micro-Total Analysis Systems, pp. 49-52.
E. Morf et al., "Partial electroosmotic pumping in complex capillary systems Part 1: Principles and general theoretical approach", Sensors and Actuators B 72 (2001), pp. 266-272.
M. Esashi, "Silicon micromachining and micromachines", Wear, vol. 168, (1993), printed in Great Britain, pp. 181-187.
Stephanus Buttgenbach et al., "Microflow devices for miniaturized chemical analysis systems", Nov. 1998, SPIE—Conference on Chemical Microsensors and Applications, vol. 3539, pp. 51-61.
Sarah Arulanandam et al., "Liquid transport in rectangular microchannels by electroosmotic pumping", Colloids and Surfaces A: Physicochemical and Engineering Aspects, vol. 161 (2000), pp. 89-102.
Linan Jiang et al., "Closed-Loop Electroosmotic Microchannel Cooling System for VLSI Circuits", Mechanical Engineering Dept. of Stanford University, pp. 1-27.
Susan L. R. Barker et al., "Fabrication, Derivatization and Applications of Plastic Microfluidic Devices", Proceedings of SPIE, vol. 4205, 2001, pp. 112-118.
Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.
Chris Bourne, "Cool Chips p/c Receives Nanotech Manufacturing Patent", Jul. 31, 2002, pp. 1-2.
Frank Wagner et al., "Electroosmotic Flow Control in Micro Channels Produced by Scanning Excimer Laser Ablation", Proceedings of SPIE vol. 4088, 2000, pp. 337-340.
H. A. Goodman, "Data Processor Cooling With Connection to Maintain Flow Through Standby Pump", Dec. 1983, IBM Technical Disclosure Bulletin, vol. 26, No. 7A, p. 3325.
"Electroerosion Micropump", May 1990, IBM Technical Disclosure Bulletin, vol. 32, No. 12, pp. 342-343.
Shulin Zeng et al., "Fabrication and Characterization of Electrokinetic Micro Pumps", 2000 Inter Society Conference on Thermal Phenomena, pp. 31-35.
A. Manz et al., "Integrated Electroosmotic Pumps and Flow Manifolds for Total Chemical Analysis Systems", 1991, Inter. Conf. on Solid-State Sensors and Actuators, pp. 939-941.
O. T. Guenat et al., "Partial electroosmotic pumping in complex capillary systems Part: 2 Fabrication and application of a micro total analysis system (µTAS) suited for continuous volumetric nanotitrations", Sensors and Actuators B 72 (2001) pp. 273-282.
J. G. Sunderland, "Electrokinetic dewatering and thickening. I. Introduction and historical review of electrokinetic applications", Feb. 4, 1987, Journal of Applied Electrochemistry, vol. 17, pp. 889-898.
J. C. Rife et al., "Acousto- and electroosmotic microfluidic controllers", Sep. 1998, Microfluidic Devices and Systems, vol. 3515, pp. 125-135.
Purnendu K. Dasgupta et al.,. "Electroosmosis: A Reliable Fluid Propulsion System for Flow Injection Analysis", Jun. 7, 1994, Anal. Chem., vol. 66, No. 11, pp. 1792-1798.
Ray Beach et al., "Modular Microchannel Cooled Heatsinks for High Average Power Laser Diode Arrays", Apr. 1992, IEEE Journal of Quantum Electronics, vol. 28, No. 4, pp. 966-976.
Roy W. Knight et al., "Optimal Thermal Design of Air Cooled Forced Finned Heat Sinks—Experimental Verification", Oct. 1992, IEEE Transactions on Components, Hybrids, and Manufacturing Technology, vol. 15, No. 6, pp. 754-760.
Y. Zhuang et al., "Experimental study on local heat transfer with liquid impingement flow in two-dimensional micro-channels", Feb. 9, 1998, Int. J. Heat Mass Transfer, vol. 40, No. 17, printed in Great Britain, pp. 4055-4059.
D. Yu et al., "An Experimental and Theoretical Investigation of Fluid Flow and Heat Transfer in Microtubes", 1995, ASME / JSME Thermal Engineering Conference, vol. 1, pp. 523-530.
Xiaoqing Yin et al., "Micro Heat Exchangers Consisting of Pin Arrays", Journal of Electronic Packaging, Mar. 1997, vol. 119, pp. 51-57.
Yin et al., "Uniform Channel Micro Heat Exchangers", Journal of Electronic Packaging, Jun. 1997, vol. 119, pp. 89-94.
Chun Yang et al., "Modeling forced liquid convection in rectangular microchannels with electrokinetic effects", International Journal of Heat and Mass Transfer 41 (1998), pp. 4229-4249.
Arel Weisberg et al., "Analysis of microchannels for integrated cooling", 1992, Int. J. Heat Mass Transfer, vol. 35, No. 10, printed in Great Britain, pp. 2465-2474.
Roger S. Stanley et al., "Two-Phase Flow in Microchannels", 1997, DSC—vol. 62/HTD—vol. 354, MEMS, pp. 143-152.
B. X. Wang et al., "Experimental investigation on liquid forced-convection heat transfer through microchannelst", 1994, Int. J. Heat Mass Transfer, vol. 37, Suppl. 1, printed in Great Britain, pp. 73-82.
Kambiz Vafai et al., "Analysis of two-layered micro-channel heat sink concept in electronic cooling", Int. J. of Heat and Mass Transfer 42 (1999), pp. 2287-2297.
Gokturk Tunc et al., "Heat transfer in rectangular microchannels", Int. J. of Heat and Mass Transfer 45 (2002), pp. 765-773.
D. B. Tuckerman et al., "High-Performance Heat Sinking for VLSI", May 1981, IEEE Electron Device Letters, vol. EDL-2, No. 5, pp. 126-129.
Bengt Sunden et al., "An Overview of Fabrication Methods and Fluid Flow and Heat Transfer Characteristics of Micro Channels", pp. 3-23.
David S. Shen et al., "Micro Heat Spreader Enhanced Heat Transfer in MCMs", 1995, pp. 189-194.
S. Sasaki et al., "Optimal Structure for Microgrooved Cooling Fin for High-Power LSI Devices", Electronic Letters, Oct. 21, 1986, vol. 22, No. 25 pp. 1332-1334.
Vijay K. Samalam, "Convective Heat Transfer in Microchannels", 1989, Journal of Electronic Materials, vol. 18, No. 5, pp. 611-617.
Sanjay K. Roy et al.,"A Very High Heat Flux Microchannel Heat Exchanger Cooling of Semiconductor Laser Arrays", May 1996, IEEE Transactions on Components, Packaging, and Manufacturing Technology—Part B, vol. 19, No. 2, pp. 444-451.

(56) References Cited

OTHER PUBLICATIONS

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM Technical Disclosure Bulletin, vol. 20, No. 10, Mar. 1978, pp. 3898-3899.

H. Krunun, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

English Translation of the Office Action(issued to Patent Application No. 093106097), 5 pages.

Office Action dated Sep. 27, 2012, U.S. Appl. No. 12/571,265, filed Sep. 30, 2009, 11 pages.

Office Action that was mailed on Jan. 9, 2012, U.S. Appl. No. 12/381,332, filed Mar. 10, 2009, 14 pages.

* cited by examiner

PUMP AND FAN CONTROL CONCEPTS IN A COOLING SYSTEM

RELATED APPLICATION

This Patent Application is a divisional application of U.S. patent application Ser. No. 10/731,674, filed Dec. 8, 2003, and entitled "PUMP AND FAN CONTROL CONCEPTS IN A COOLING SYSTEM," which is incorporated herein by reference. The U.S. patent application Ser. No. 10/731,674 claims priority under 35 U.S.C. 119 (e) of the U.S. Provisional Patent Application, Ser. No. 60/489,730 filed Jul. 23, 2003, and entitled "PUMP AND FAN CONTROL APPARATUS AND METHOD IN CLOSED FLUID LOOP," which is also hereby incorporated by reference.

FIELD OF THE INVENTION

This invention relates generally to the field of thermal management systems. More specifically, this invention relates to cooling heat-generating devices by using various temperature sensors, control schemes and thermal models, through the control of operating conditions of a pump and a fan in a cooling system.

BACKGROUND OF THE INVENTION

A variety of applications require cooling of devices that have very high heat fluxes, such as in the range of 50-1000 W/cm$^2$. These devices include integrated electronic circuits in microprocessors, laser diodes, and power semiconductor devices for control electronics.

In conventional electronic systems, such as computers, heat generated by one or more of these heat-generating devices is transferred to its surroundings through the use of a heat sink and one or more fans. Conventional heat sinks are passive except for the use of the fans, which can be controlled based on a signal from a temperature sensor within the computer or on the heat-generating device. The fans draw cool air into the heat sink and push warm air out. There may also be fans mounted directly on the heat sink. In some circumstances, the fan speed is controlled such that it increases when the device gets warmer and decreases when the device gets cooler. The goals of the heat sink and fan assembly are generally to keep the device below an acceptable maximum temperature.

What is needed is an improved cooling system that regulates both pump and fan speed in a concerted manner to maintain a heat-generating device within its allowed temperature range while conserving power and reducing system noise and transients thereof.

BRIEF SUMMARY OF THE INVENTION

According to a first aspect of the present invention, an apparatus for controlling a fluid flow rate of at least one pump and an air flow rate of at least one fan, in a cooling system for cooling at least one device is disclosed. The apparatus comprises a means for sensing a temperature value of the device. The means for sensing the temperature value can be at least one temperature sensor coupled to measure a temperature value of the device or devices. Alternatively, if the device is an electronic circuit, such as a microprocessor, the means for sensing the temperature value can be an electric current or electric power sensor from which temperature of the device is inferred. A controller is coupled to receive the temperature value and to selectively control the fluid flow rate, the air flow rate, or both based on the temperature value. The fluid system can be a closed loop system.

The apparatus can further include a heat exchanger thermally coupled to the device where at least a portion of the heat exchanger is filled with a thermal capacitance medium for maintaining the temperature value of the device below a maximum allowable temperature during thermal transients. The medium is preferably laterally distributed in the heat exchanger. Either the pump or the fan or both can be controlled such that the temperature value of the device is maintained below a maximum allowable temperature. Alternatively, one of the fan and pump can be maintained at a constant maximum speed and the other of the fan and pump controlled such that the temperature value of the device is maintained below a maximum allowable temperature such that acoustic transients are reduced. The pumps can be controlled independently of the fans. Alternatively, the pumps can be controlled cooperatively with the fans in a manner that optimizes one or more of several performance metrics.

The apparatus can further include at least one current sensor coupled to one or more devices, to provide information which is representative of the current delivered to the devices and indicative of the total electric power consumed by each of the devices. The total electric power consumed by each device is proportional to the steady-state operating temperature of that device. The controller is coupled to receive the information provided by the current sensors. The controller can adjust a current supplied to the pumps and the fans in response to the measured current values of each device. The controller can also adjust a voltage supplied to the pumps and the fans in response to the measured temperature values of each device. The system can have one or more pumps, fans, devices, heat exchangers, heat rejectors, controllers, and sensors.

The apparatus can also include a valve or valves for regulating the fluid flow rate. Each valve is selectively opened and closed to a variable state in response to one of the measured quantities, such as the temperature value of a device.

Power consumption of the cooling system can be reduced to a minimal level responsive to changes in demand for delivering power to each pump and fan. Time variations in noise level of each fan and pump can be minimized according to a predetermined criteria. A sum of the noise level of each fan and pump can be minimized. The temperature of each device can be maintained between a minimum temperature level and a maximum temperature level, while assuring that the power consumption of the cooling system is reduced to a minimum level.

In one embodiment, the controller can include a control algorithm based on a thermal time constant, wherein the thermal time constant is a product of a thermal resistance value and a thermal capacitance value. The thermal time constant can be applied to develop optimal control schemes for the pumps and the fans, in response to power consumed from the device or devices. The optimal control schemes can adjust the fluid flow rate of one or more pumps, the air flow rate of one or more fans, or both. For example, the optimal control schemes can include increase of fluid flow rate of the pump, with no increase of air flow rate of the fan. Alternatively, the optimal control schemes can include increase of fluid flow rate of the pump, with a gradual increase of air flow rate of the fan, thus reducing acoustic transients. Alternatively, the optimal control scheme can include decrease of fluid flow rate of the pump, with no change of air flow rate of the fan.

According to an alternative aspect of the present invention, an apparatus for controlling a fluid flow rate of at least one pump in a cooling system for cooling at least one device is disclosed. The apparatus comprises at least one temperature sensor for measuring a temperature of the device, the fluid, or both. Alternatively, the power consumed by the device can be measured and used to estimate the temperature of the device. The apparatus also includes at least one controller for varying the fluid flow rate of the pump based on the temperature of the device. The controller preferably drives each pump at roughly a constant low fluid flow rate when the measured device temperature is below a predetermined temperature value and at roughly a constant high fluid flow rate when the measured fluid temperature is above the predetermined temperature value. Further, the controller preferably drives each pump at a minimum pump voltage or pump current when the measured device temperature is below a predetermined minimum temperature value and at a maximum pump voltage or pump current when the measured device temperature is above a predetermined maximum temperature value. The controller can drive each pump between a pump minimum flow rate and a pump maximum flow rate in response to the measured device temperature.

The system can further include at least one fan, wherein the one or more pumps are controlled in response to the measured device temperature while the fan remains at a roughly constant operational state, thereby minimizing time variations of noise level generated by the fans and the pumps. The time variations of noise level of the pumps can be minimized according to predetermined criteria. The noise level generated by each pump can be maintained at a minimum noise level.

In another embodiment of the present invention, a method of controlling a fluid flow rate of at least one pump and an air flow rate of at least one fan, in a cooling system for cooling at least one device is disclosed. The method comprises the steps of: providing at least one temperature sensor coupled to measure a temperature value of each device; receiving the temperature value from each temperature sensor; and providing a controller to selectively control the fluid flow rate and the air flow rate, based on each temperature value. The method can further include the step of filling at least a portion of a heat exchanger with a thermal capacitance medium for maintaining the temperature value of the device below a maximum allowable temperature during thermal transients, wherein the heat exchanger is thermally coupled to the device.

In another embodiment of the present invention, an apparatus for controlling a fluid flow rate of at least one pump and an air flow rate of at least one fan, in a cooling system for cooling at least one device, is disclosed. The apparatus comprises at least one circuit for measuring a current consumed by the device and for forming a signal representative thereof; and a controller coupled to receive the signal and to selectively control the fluid flow rate and the air flow rate, in response thereto.

DETAILED DESCRIPTION OF THE INVENTION

Reference will now be made in detail to the preferred and alternative embodiments of the invention, examples of which are illustrated in the accompanying drawings. While the invention will be described in conjunction with the preferred embodiments, it will be understood that it is not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be noted that the present invention may be practiced without these specific details. In other instances, well known methods, procedures and components have not been described in detail as not to unnecessarily obscure aspects of the present invention.

Figure 1:
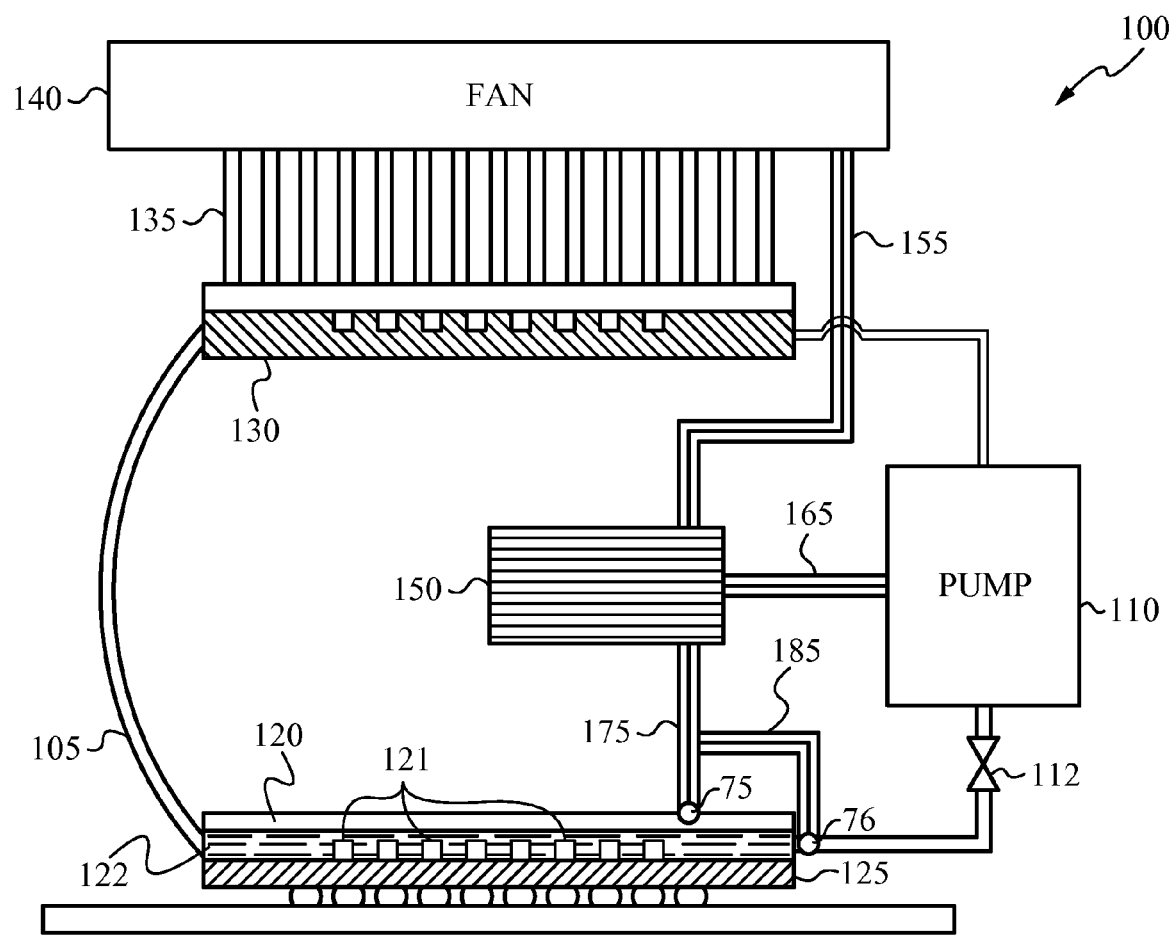
FIG. 1 illustrates a cooling system in accordance with an embodiment of the present invention.

Referring now to the drawings and particularly to FIG. 1, there is shown one embodiment of a cooling system 100, which can include a hermetically sealed loop, that can be used in the apparatus and method of the present invention. The system 100 comprises a heat exchanger 120, in which a fluid absorbs waste heat from a heat-generating device 125, a heat rejector 130, which transfers waste heat from the liquid to a surrounding ambient environment, and a pump 110, which forces the fluid to flow through the heat exchanger 120 and then through the heat rejector 130. Though the heat exchanger 120 includes microchannels 121, it will be appreciated by those of ordinary skill in the art that other types of heat exchangers can be used under the teachings of the present invention including those without microchannels. For example, as an alternative the heat-generating device 125 can be designed with internal flow regions or microchannels built into the heat-generating device 125. The heat-generating device 125, of which the system 100 can include one of many types of heat sources including but not limited to an integrated electronic circuit in microprocessors, laser diodes, and power semiconductor devices for control electronics. The fluid travels through the system 100 via a fluid transport line 105.

The system 100 circulates either the fluid without phase change or with phase change, such as boiling, and then condensing at the heat rejector 130. The heat rejector 130 can include a plurality of fins 135 for further assisting in conducting heat away from the system 100. The heat rejector 130 can be coupled to a fan 140 via the fins 135, and is therefore positioned in an airflow path of the fan 140. However, the fan can be located at any location in the system 100.

The pump 110 and the fan 140 are responsive to a controller 150. The controller 150 receives data input through electrical signal paths 155, 165 and 175, to numerous sensors, for example temperature sensor 75, positioned to measure a heat operating level of the heat-generating device 125 and the temperature within the heat exchanger 120. The heat operating level can be a die temperature during operation of the system 100. Temperature sensors (not shown) can also be located within the heat rejector 130, the fins 135, the pump 110, and anywhere along the fluid transport line 105 for the fluid at any point in the system 100. The temperature sensor (not shown) can also be embedded in the device 125 and a representative signal can be provided by the device 125. Additional electrical signal paths (not shown) can be coupled to the heat rejector 130, the fins 135, anywhere along the fluid transport line 105, and to any location where there is a sensor. The sensors generate signals that represent the temperature sensed and transmit those signals over the electrical signal paths 155, 165 and 175 to the controller 150. Also, the system 100 can include current sensors (not shown) and pressure sensors such as pressure sensor 76, coupled to the controller 150 by electrical signal path 185 for one or more heat-generating devices in the system 100. The current sensors (not shown) and the pressure sensors (not shown) can generate an output signal proportional to temperature. In addition to temperature sensors, current sensors and pressure sensors, ambient temperature sensors (not shown) to measure temperature values of ambient air around the heat-generating device 125, and flow rate sensors (not shown) with corresponding flow valves (not shown) can be added. It should also be understood, in accordance with the present invention, that the controller 150 can be configured to simultaneously respond to multiple sensors, or to modify an operating state of various components such as the pump 110 and the fan 140. The present invention further discloses a system having one or more pumps, fans, heat-generating devices, heat exchangers, heat rejectors, controllers, and sensors.

The controller 150 coordinates the various signals received and controls a flow rate of the pump 110 and an airflow of the fan 140, via wires 165 and 155, respectively, in response thereto. For example, the controller 150 can actuate the pump 110 to increase an amount of flow if the temperature of the heat-generating device 125 is above a specified temperature, or it can decrease the amount of heat being removed if the temperature of the heat-generating device 125 is below the specified temperature. Alternatively, the controller 150 can stop the pumping of the fluid altogether when the temperature of the heat-generating device 125 falls below the specified temperature. As mentioned above, the controller 150 can also regulate the airflow of the fan 140. For example, the controller 150 can actuate the fan 140 to increase airflow if the temperature of the heat-generating device 125 is above the specified temperature, or it can decrease the airflow of the fan 140 if the temperature of the heat-generating device 125 is below the specified temperature. Alternatively, the controller 150 can stop the airflow of the fan 140 altogether when the temperature of the heat-generating device reaches the specified temperature. It should also be understood, in accordance with the present invention, that the controller 150 can be configured to control both the pump 110 and the fan 140 cooperatively or independently to achieve and maintain proper regulation of the system 100, and also to reduce power consumption of the system 100 to a minimal level responsive to changes in demand for delivering power to the pump 110 and the fan 140. Alternatively, the controller 150 can be configured to reduce an acoustic noise level of the system 100 to a minimal level responsive to changes in demand for delivering power to the pump 110 and the fan 140.

An important feature of the present invention is that a temperature value of the heat-generating device 125 can be maintained between a minimum temperature level and a maximum temperature level, such that the power consumption of the system 100 or the acoustic noise level of the system 100 or both is reduced to a minimum level. Further, the controller 150 can be coupled to a control valve 112 of the system 110. Thus, the controller 150 can open or close the control valve 112 to a variable opening position in response to the temperature value. The controller 150 can also control the pump 110 and the fan 140 in response to the temperature of the heat-generating device 125 and/or the fluid at any location in the system 100.

In prior art cooling systems utilizing conventional heat sinks, when fan voltage is reduced to reduce noise, the heat sink temperature immediately increases. At the same time, the temperature of the heat-generating device will increase accordingly. In the present invention, the system 100 can reduce noise generated by the fan 140 and/or the pump 110 while maintaining adequate cooling of the heat-generating device 125. The pump 110 and the fan 140 can have relationships between speed and noise. Further, time variations in noise level of at least one of the fan 140 and the pump 110 can be minimized according to predetermined criteria. If the pump 110 is an electrokinetic pump, for example, it will be silent or nearly silent during operation. Therefore, the system 100 can minimize noise by operating the pump 110 at a maximum flow rate, and operating the fan 140 at a minimum rate which provides adequate cooling performance. Alternatively, the pump 110 and the fan 140 can have relationships between noise and power. The system can be optimized to provide adequate cooling power while minimizing power consumption of the fan 140 and the pump 110. In addition, the system 100 can control "operational states" for the fan 140 and the pump 110, such as voltage, current, or an operational curve relating pressure to flow rate for the pump 110 and/or the fan 140, to maximize reliability, or to minimize other desirable characteristics, such as changes in the speed of the fan 140, variations in the airflow of the fan 140 past other components or parts of the system 100, EMI (electromagnetic interference) generation by the fan, accumulation of dust, and so forth. As an example, the controller 150 can gather data relating fan speed to power consumption and airflow of the fan 140. With the heat exchanger 120 and the heat rejector 130 as components of the system 100, it is possible to characterize thermal performance of the system 100 as a function of the "operational states" of the fan 140 and the pump 110.

The system 100 can be characterized in general as single-input-multiple-output (a single thermal input signal used to control one or more pumps and one or more fans), or multiple-input-multiple-output (more than one input signal used to control one or more pumps or one or more fans). The present invention discloses the use of single-input-multiple-out or multiple-input-multiple-output control systems for all electronic cooling systems that include at least one pump and at least one fan.

Another inventive feature of the present invention is that the controller 150 can use a cost function for optimization of various components, such as the heat exchanger 120, to minimize operation costs while maintaining adequate cooling conditions within the system 100. Optimization can be achieved by determining the power consumption of the system at minimal levels, the time variations at a minimal noise level, the temperature values maintained between the minimum and maximum temperature levels, and the noise level generated and maintained at the minimum noise level.

Figure 2:
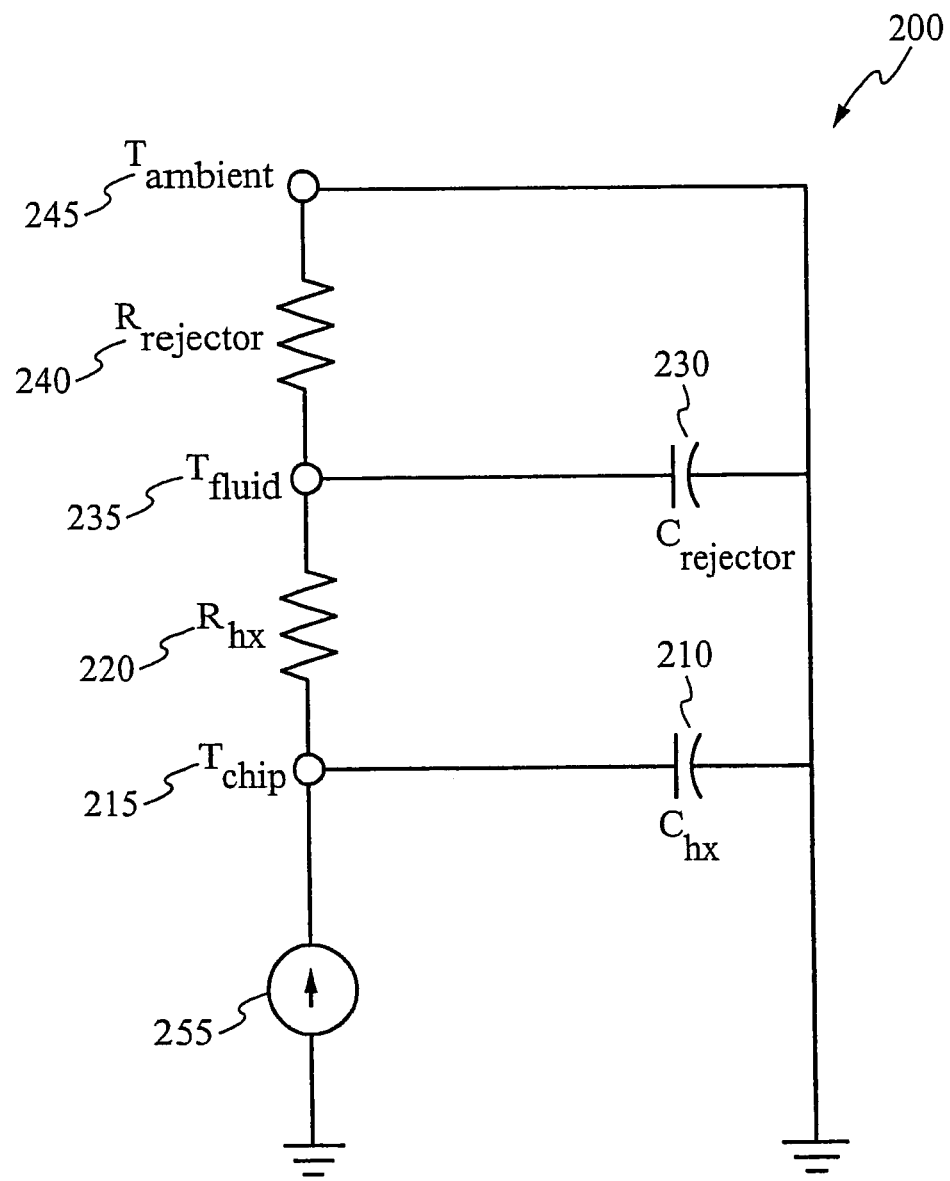
FIG. 2 illustrates a thermal circuit model for a cooling system in accordance with the present invention.

FIG. 2 is a thermal circuit model 200 for a cooling system, which is analogous to an electrical circuit. The thermal circuit model 200 divides the system into two separate groups of thermal resistors and thermal capacitors between three temperature nodes, namely, heat-generating device temperature 215, the average fluid temperature 235, and ambient air temperature 245. A heat exchanger thermal resistance 220 depends on a pump flow rate geometry, material and design of the heat exchanger. A heat rejector thermal resistance 240 depends on the pump flow rate and a fan flow rate. The thermal resistance is described by a rise in temperature for each unit in thermal resistance passing through the material. A heat exchanger thermal capacitance 210 and a heat rejector thermal capacitance 230 describe an amount of energy taken in by those components for each degree of temperature rise. A current source 255 models the thermal power output of the heat-generating device.

According to the thermal circuit model 200, the ambient air temperature 245, modeled as an electrical circuit node, is coupled to a first terminal of the heat rejector thermal resistance 240, modeled as a electrical resistor, and also to ground. A second terminal of the heat rejector thermal resistance 240 is coupled to the average fluid temperature 235, modeled as an electrical circuit node, and also to a first terminal of the heat rejector thermal capacitance 230, which is modeled as an electrical capacitor. A second terminal of the heat rejector thermal capacitance 230 is coupled to ground. The fluid temperature 235 is also coupled to a first terminal of the heat exchanger thermal resistance 220, modeled as an electrical resistor. A second terminal of the heat rejector thermal resistance 240 is coupled to the heat-generating device temperature 215, modeled as an electrical circuit node, and also to a first terminal of the heat exchanger thermal capacitance 210, which is modeled as an electrical capacitor. The heat-generating device temperature is also coupled to the thermal output of the heat-generating device which is modeled as an electrical current source 255.

In one embodiment of the present invention, a portion of the heat exchanger 120 (FIG. 1) can be filled with a thermal capacitance medium 122 for maintaining the temperature value of the heat-generating device 125 (FIG. 1) below a maximum allowable temperature during a thermal transient or increase in power output. The medium 122 can consist of high specific heat materials and is preferably laterally distributed in the heat exchanger 120 (FIG. 1).

A thermal resistance represents a ratio of a temperature difference between, for example, the heat-generating device 125 (FIG. 1) and the fluid in the heat exchanger 120 (FIG. 1) divided by heat power removed from the heat-generating device 125 (FIG. 1). This parameter has units of degrees/watt, and small ratio values represent better system performance than large ratio values. As an example, if the ambient air temperature is 40 degrees Celsius and the heat-generating device 125 (FIG. 1) cannot operate above 100 degrees Celsius, and the power consumption is 60 Watts, the thermal resistance must be lower than 1 degrees/Watt. A higher thermal resistance would lead to a higher operating temperature for the heat-generating device 125 (FIG. 1). Total resistance between the heat-generating device 125 (FIG. 1) and the ambient air is the sum of the heat-generating device-fluid temperature resistor 220 and the fluid-ambient resistor 240. For a control scheme where both fan speed and pump flow rate are controllable, it is useful and approximately correct to break the system resistance into the two resistors 220 and 240, as shown in FIG. 2, and to associate the two resistors 220 and 240 with the capacitors 210 and 230 as indicated in FIG. 2.

The thermal resistance between the heat-generating device 125 (FIG. 1) and the fluid decreases with increasing values of the flow rate of the pump 110 (FIG. 1). For a given value of total thermal resistance, there can be many combinations of pump and fan speed that provide an adequate system performance. In general, it is possible to reduce the speed of the fan 140 (FIG. 1) and increase the speed of the pump 110 (FIG. 1) and still maintain adequate system performance. This would result in a decrease in the heat exchanger thermal resistance 220 ($R_{hx}$) and an increase in the heat rejector thermal resistance 240 ($R_{rejector}$). Since the pump and fan can be independently controlled, it is possible to arrange for a fixed total thermal resistance while changing the pump and fan operation such that: $R_{hx}+R_{rejector}$=constant). This would allow optimization of some other parameter, such as total power or total noise, while maintaining desired cooling system performance.

The controller 150 (FIG. 1) can include a control algorithm based on a thermal time constant, which is the product of thermal resistance and thermal capacitance. The thermal capacitance of the heat exchange and the heat rejector can be adjusted by changing the mass of their respective structures, by changing their materials or by adding a layer of material with different thermal properties.

As an example, consider the case that the heat-generating device is a microprocessor. The amount of electric power consumed by the device varies substantially as the tasks performed by the microprocessor change. Typical microprocessors have a maximum allowable temperature (MAT). Ideally, the microprocessor is allowed to operate at a relatively high temperature, just below the MAT, so that the electric power consumed by and also the acoustic noise generated by the cooling are both minimized.

Figure 6:
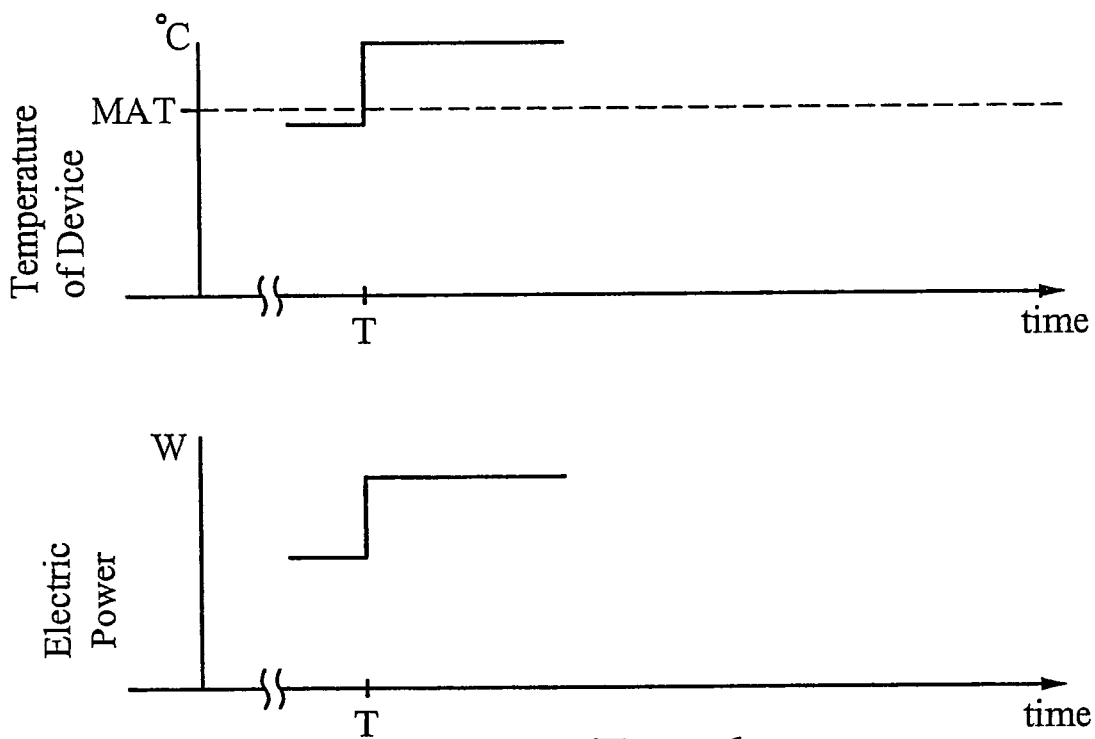
FIG. 6 illustrates the temperature and power consumption of the device of FIG. 1 as a function of time under both steady state conditions prior to a time T and during a surge in power consumption of the device at time T.
Figure 7:
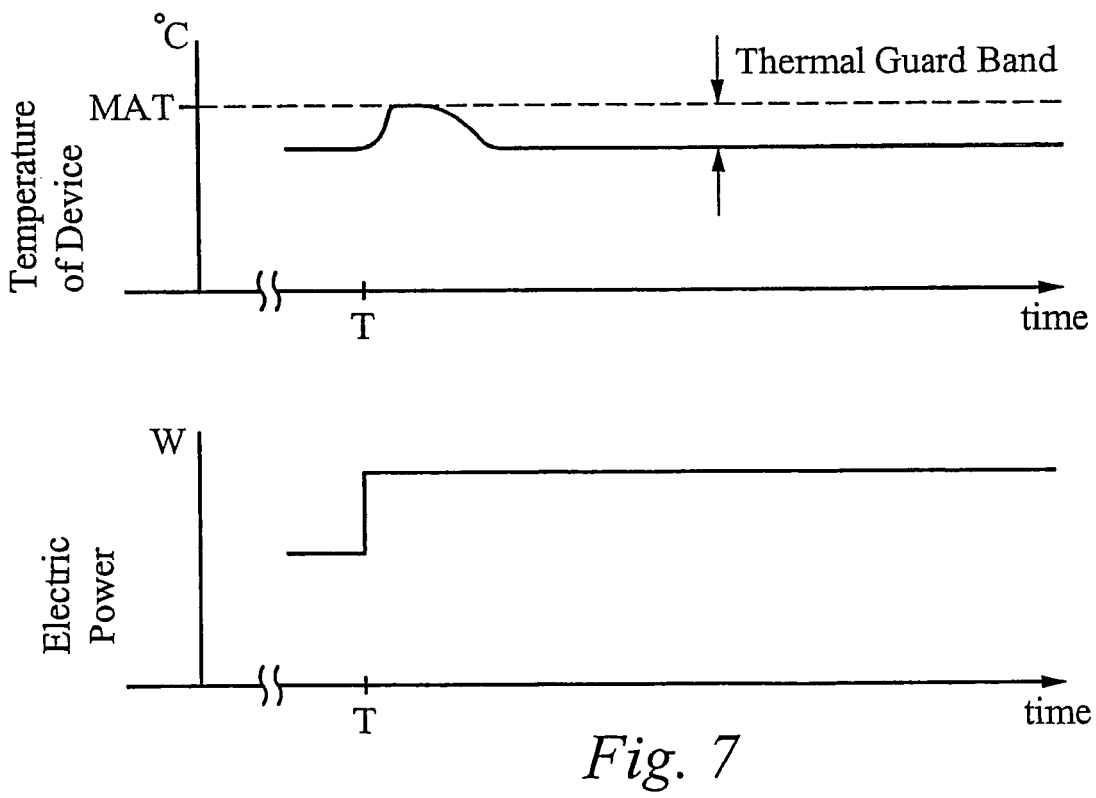
FIG. 7 illustrates the effect of introducing thermal capacitance to the system of FIG. 1 so that the temperature of the device of FIG. 1 is maintained below a maximum allowable temperature during a surge in power consumption of the device at time T.

As the amount of electric power changes the temperature of the device changes nearly immediately in the absence of the present invention. FIG. 6 shows a microprocessor initially operating in steady state, with a temperature lower than the MAT. At a time T, the electric power (in Watts) consumed by the microprocessor increases. The temperature of the device rises very quickly. With prior art systems, the temperature of the microprocessor would need to operate much lower than the MAT or else increases in power consumption would allow the temperature to exceed the MAT. This is especially true because prior art systems could not react quickly to changes in device temperature The present invention contemplates appropriately selecting the thermal capacitance to accommodate transient power signals. By adjusting the thermal capacitance of the system of the present invention, the time for the device to increase in temperature increases is slowed. In FIG. 7, the microprocessor again increases its electric power consumption at time T. However, because the thermal capacitance of the system is increased, the temperature of the microprocessor increases relatively slowly allowing the system ample time to compensate for the increased thermal power output of the microprocessor by appropriately adjusting the fluid flow rate of the pump or the air flow rate of the fan or both as discussed herein. This allows the designer to select a thermal capacitance relative to the desired thermal guardband to control the amount of electric power consumed by the one or more pumps and the one or more fans in the system. As the thermal capacitance is decreased, the thermal guardband is correspondingly increased such that more electric power is consumed by the cooling system of the present invention. Likewise, as the thermal capacitance is increased, the thermal guardband is correspondingly decreased and less electric power is consumed by the cooling system.

Control schemes can be developed and based on a thermal time constant. The thermal time constant can be applied to develop optimal control schemes for the pump 110 (FIG. 1) and the fan 140 (FIG. 1), in response to temporal power signal consumed by the heat-generating device 125 (FIG. 1). For example, upon knowing the thermal time constant of the heat exchanger (FIG. 1), and a range of power surges of the heat generating device 125 (FIG. 1), optimal control schemes can be designed to operate the fan 140 (FIG. 1) and the pump 110 (FIG. 1) so that the temperature of the heat generating device 125 (FIG. 1) is maintained at a "margin" below a maximum temperature at normal operating conditions. During a power surge of the heat generating device 125 (FIG. 1), the pump 110 (FIG. 1) and the fan 140 (FIG. 1) will react immediately, but the device 125 (FIG. 1) temperature will not exceed beyond the maximum temperature, therefore not allowing the heat generating device 125 (FIG. 1) to throttle back. This feature of the present invention allows the heat generating device 125 (FIG. 1) to operate at full performance regardless of any power surge while also reducing transients in acoustics.

The optimal control schemes can also include an increase of fluid flow rate of the pump 110 (FIG. 1), with no increase of air flow rate of the fan 140 (FIG. 1). Alternatively, the optimal control schemes can include an increase of the air flow rate of the fan 140 (FIG. 1), with no increase in the fluid flow rate of the pump 110 (FIG. 1). The fan speed can be increased slowly in order to reduce any acoustic transients. The optimal control schemes can include use of empirical data for developing the optimal control schemes. The empirical data can include temperature measurements of each heat-generating device 125 (FIG. 1), the fluid in the heat rejector 130 (FIG. 1), and the fluid in the heat exchanger 120 (FIG. 1), as a function of either pump flow rate of the pump 110 (FIG. 1) or air flow rate of the fan 140 (FIG. 1), or both.

The use of a current sensor in the system provides some unique advantages. The current sensor directly detects the power input to the heat generating device, and is therefore a predictor of temperature changes. The temperature sensors have delayed responses because of the thermal time constants. Therefore a control system based on a current sensor can cause changes in pump and fan voltages that provide faster response to transients and more accurate control. In particular, an abrupt rise in current can be handled by producing an abrupt rise in pump flow rate, since the pump has a faster cooling response than the fan.

Figure 3:
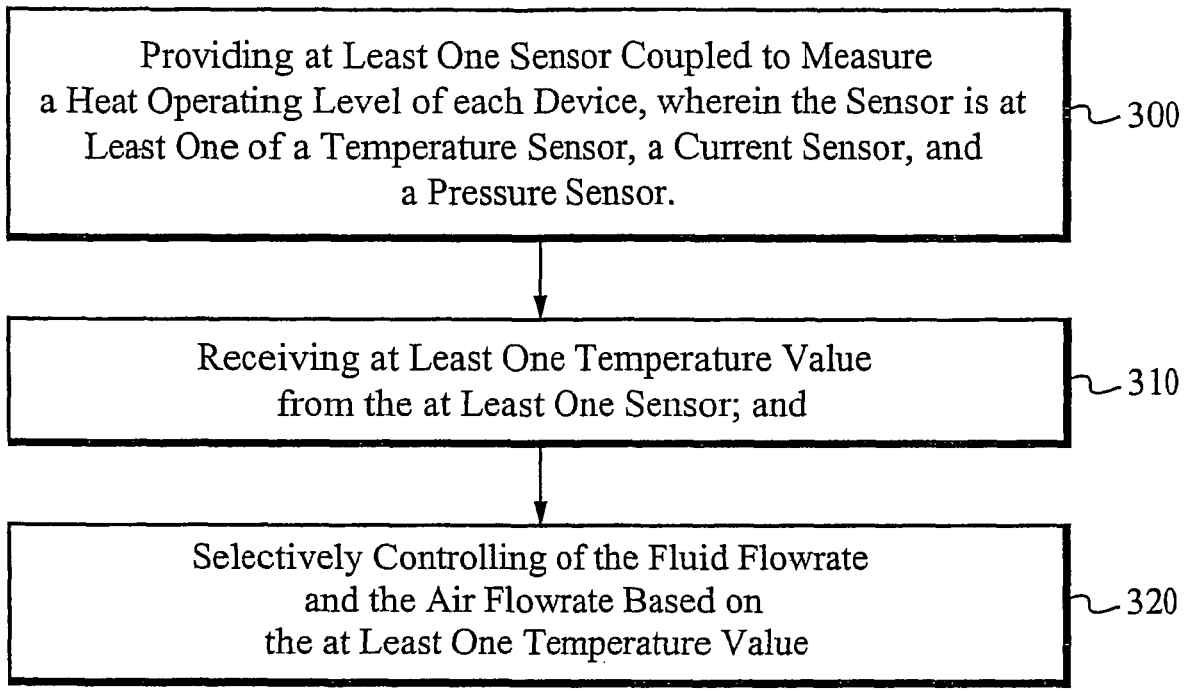
FIG. 3 is a schematic flowchart illustrating steps of an alternative method of the present invention.

In another embodiment of the present invention, as shown in FIG. 3, a method of controlling a fluid flow rate of at least one pump and an air flow rate of at least one fan, in a cooling system for cooling at least one device, is disclosed. In the step 300, at least one sensor is provided, wherein the sensors can be temperature sensors, current sensors, or pressure sensors. Each sensor is coupled to measure a temperature value of each device; In the step 310, at least one temperature value from the at least one sensor is received. In the step 320, the fluid flow rate and the airflow rate are selectively controlled based on the temperature value.

Figure 4A:
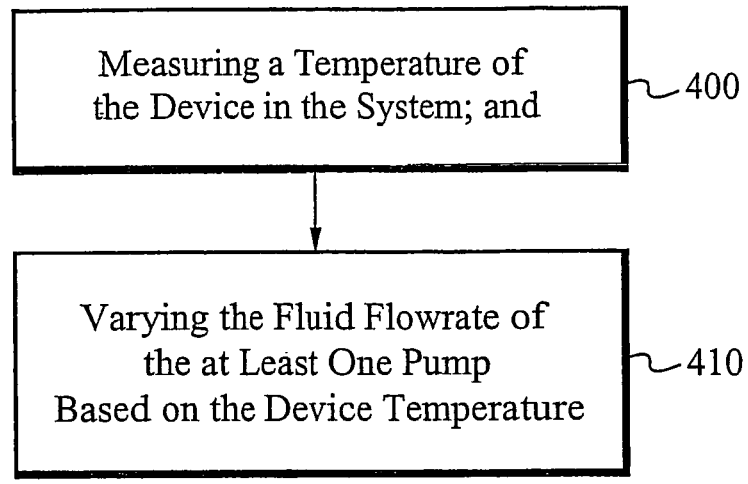
FIG. 4A is a schematic flowchart illustrating steps of an alternative method of the present invention.

In another embodiment of the present invention, as shown in FIG. 4A, a method of controlling a fluid flow rate of at least one pump in a cooling system for cooling at least one device is disclosed. In the step 400, a temperature of the device is measured. In the step 410, the fluid flow rate of the at least one pump is varied based upon the device temperature.

Figure 4B:
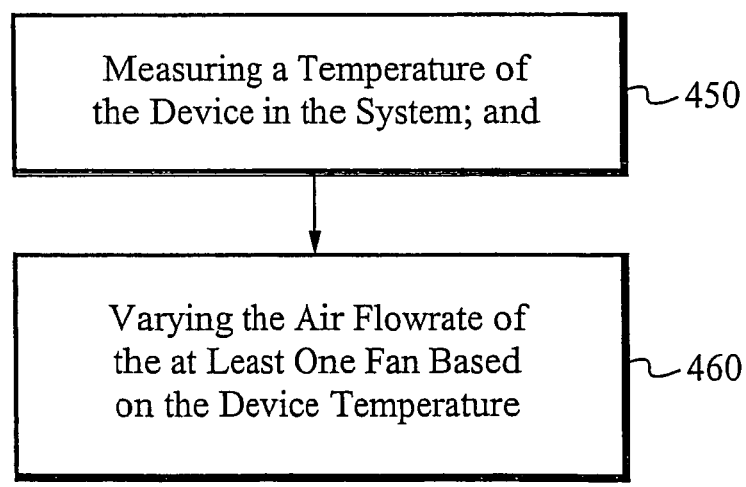
FIG. 4B is a schematic flowchart illustrating steps of an alternative method of the present invention.

In another embodiment of the present invention, as shown in FIG. 4B, a method of controlling an air flow rate of at least one fan in a cooling system for cooling at least one device is disclosed. In the step 450, a temperature of the device in the system is measured. In the step 460, the air flow rate of the at least one fan is varied based upon the device temperature.

Figure 5:
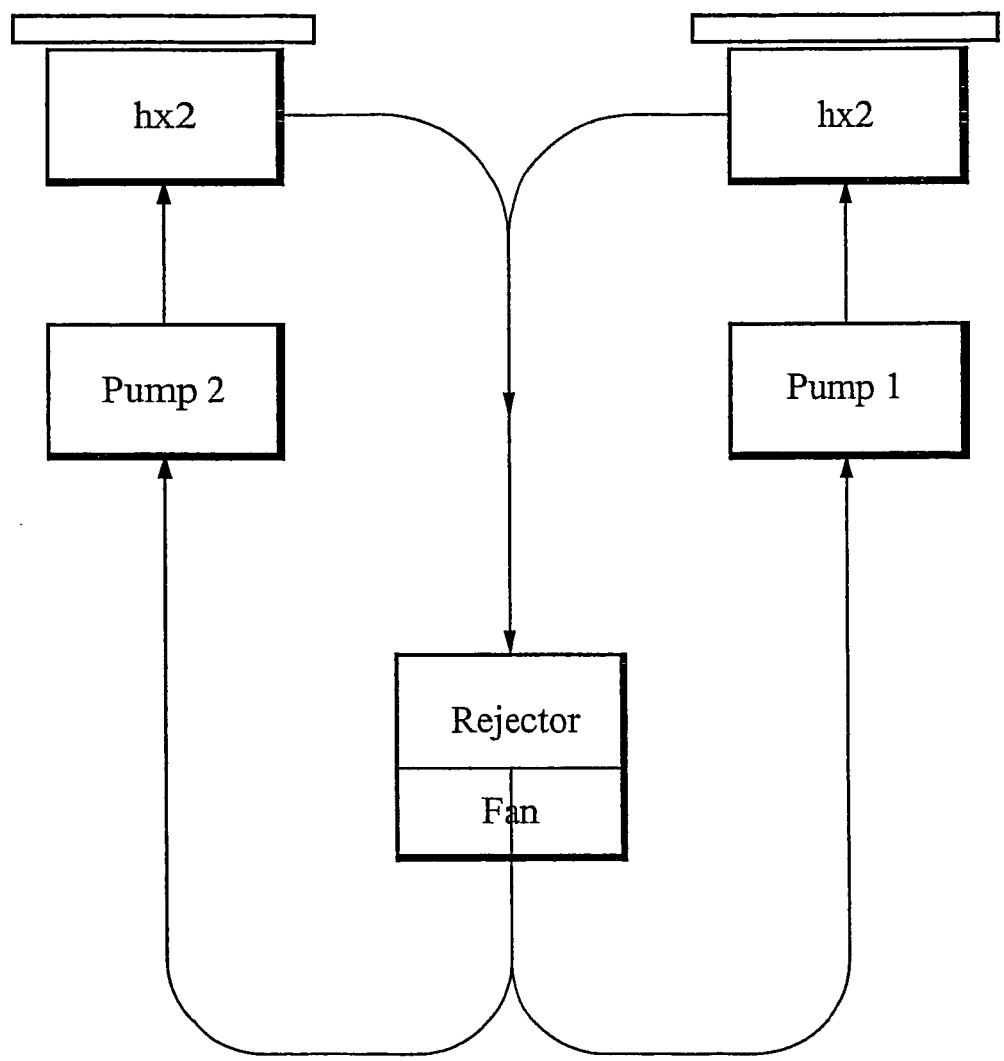
FIG. 5 illustrates a schematic diagram of an alternative system of the present invention.

As mentioned, the present invention further discloses a system having one or more pumps, fans, heat-generating devices, heat exchangers, heat rejectors, controllers, and sensors. For example, as shown in FIG. 5, a cooling system can include two pumps, two heat exchangers, one heat rejector and one fan, or other combinations.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

What is claimed is:

1. A single closed loop cooling system and apparatus for controlling a fluid flow rate through the single closed loop cooling system, the apparatus comprising:
   a heat exchanger coupled to at least one heat generating device, the heat generating device having a temperature value, for removing waste heat from the heat generating device;
   the fluid for transferring waste heat away from the heat exchanger;
   at least one pump for circulating the fluid;
   a heat rejector for receiving the fluid,
   wherein the heat exchanger, at least one pump and heat rejector lie on a closed loop;
   at least one fan having an air flow rate therethrough for removing waste heat from the heat rejector;
   at least one temperature sensor directly coupled to the heat generating device to measure the temperature value of the at least one heat generating device; and
   a controller electrically coupled to the at least one pump, the at least one fan, and the at least one temperature sensor for receiving the temperature value to selectively control the fluid flow rate and the air flow rate, based on the temperature value.

2. The single closed loop cooling system and apparatus of claim 1, wherein the at least one heat generating device comprises an electronic circuit.

3. The single closed loop cooling system and apparatus of claim 2, wherein the electronic circuit is a microprocessor.

4. The single closed loop cooling system and apparatus of claim 1, wherein at least a portion of the heat exchanger is filled with a thermal capacitance medium for maintaining the temperature value of the at least one heat generating device below a maximum allowable temperature during thermal transients in the heat generating device.

5. The single closed loop cooling system and apparatus of claim 4, wherein the thermal capacitance medium is laterally distributed in the heat exchanger.

6. The single closed loop cooling system and apparatus of claim 4, wherein the at least one pump and the at the least one fan are controlled such that the temperature value of the at least one heat generating device is maintained below a maximum allowable temperature.

7. The single closed loop cooling system and apparatus of claim 4, wherein the at least one fan is maintained at a constant maximum speed and the at least one pump is controlled such that the temperature value of the at least one heat generating device is maintained below a maximum allowable temperature and acoustics transients resulting from the operation of at least one of the pump and the at least one fan are reduced.

8. The single closed loop cooling system and apparatus of claim 4, wherein the at least one fan is ramped up to a maximum speed and the at least one pump is controlled such that the temperature value of the at least one heat generating device is maintained below a maximum allowable temperature and acoustic transients resulting from the operation of at least one of the pump and the at least one fan are reduced.

9. The single closed loop cooling system and apparatus of claim 4, wherein the at least one fan is ramped down to a minimum speed and the at least one pump is controlled such that the temperature value of the at least one heat generating device is maintained below a maximum allowable temperature and acoustic transients are reduced.

10. The single closed loop cooling system and apparatus of claim 1, further including at least one current sensor coupled to the at least one heat generating device, to provide information which is representative of current delivered to the at least one heat generating device and indicative of total power consumed by the at least one heat generating device, wherein the controller is coupled to receive the information provided by the at least one current sensor.

11. The single closed loop cooling system and apparatus of claim 1, further including at least one pressure sensor measuring a pressure of the fluid at any position in the system, wherein the controller is coupled to receive the information provided by the at least one pressure sensor.

12. The single closed loop cooling system and apparatus of claim 1, wherein the at least one temperature sensor measures temperature values of ambient air around the at least one heat generating device.

13. The single closed loop cooling system and apparatus of claim 1, wherein the at least one temperature sensor measures temperature values of the fluid at any point in the cooling system.

14. The single closed loop cooling system and apparatus of claim 1, wherein the controller adjusts a current supplied to the at least one pump in response to the measured temperature value of the at least one heat generating device.

15. The single closed loop cooling system and apparatus of claim 1, wherein the controller adjusts a voltage supplied to the at least one pump in response to the measured temperature value of the at least one heat generating device.

16. The single closed loop cooling system and apparatus of claim 1, wherein the controller adjusts a current supplied to the at least one fan in response to the measured temperature value of the at least one heat generating device.

17. The single closed loop cooling system and apparatus of claim 1, wherein the controller adjusts a voltage supplied to the at least one fan in response to the measured temperature value of the at least one heat generating device.

18. The single closed loop cooling system and apparatus of claim 1, wherein the controller adjusts an average power supplied to the at least one fan with a pulse width modulated signal.

19. The single closed loop cooling system and apparatus of claim 1, further including a valve for regulating the fluid flow rate, which is selectively opened and closed to a variable state in response to the measured temperature value.

20. The apparatus of claim 1, wherein the at least one pump is controlled independently of the at least one fan.

21. The single closed loop cooling system and apparatus of claim 1, wherein the at least one pump is controlled cooperatively with the at least one fan.

22. The single closed loop cooling system and apparatus of claim 1, wherein a power consumption of the cooling system is reduced to a minimal level by changing a power delivered to the at least one pump and the at least one fan.

23. The single closed loop cooling system and apparatus of claim 1, wherein a noise of the at least one pump is held constant while the at least one fan is used to control the temperature value of the at least one heat generating device.

24. The single closed loop cooling system and apparatus of claim 1, wherein a noise of the at least one fan is held constant while the at least one pump is used to control the temperature value of the at least one heat generating device.

25. The single closed loop cooling system and apparatus of claim 1, wherein time variations in noise level of the at least one fan are minimized according to predetermined criteria.

26. The single closed loop cooling system and apparatus of claim 1, wherein time variations in noise level of the at least one pump are minimized according to predetermined criteria.

27. The single closed loop cooling system and apparatus of claim 1, wherein time variations in noise level of the at least one pump and the at least one fan are minimized according to predetermined criteria.

28. The single closed loop cooling system and apparatus of claim 1, wherein a sum of the noise level of the at least one fan and the at least one pump is minimized.

29. The single closed loop cooling system and apparatus of claim 1, wherein the temperature values of the at least one heat generating device are maintained between a minimum temperature level and a maximum temperature level, such that the power consumption of the cooling system is reduced to a minimum level.

30. The single closed loop cooling system and apparatus of claim 1, wherein the controller is configured to control the at least one pump and the at least one fan according to a thermal time constant, wherein the thermal time constant is a product of a thermal resistance value and a thermal capacitance value.

31. The single closed loop cooling system and apparatus of claim 30, wherein the controller is configured control the the at least one pump and the at least one fan, in response to power consumed by the at least one heat generating device, according to the thermal time constant and the thermal capacitance value.

32. The single closed loop cooling system and apparatus of claim 31, wherein the wherein the controller is configured to increase of the fluid flow rate of the at least one pump, with no increase of the air flow rate of the at least one fan.

33. The single closed loop cooling system and apparatus of claim 31, wherein the wherein the controller is configured to increase of the fluid flow rate of the at least one pump, with a gradual increase of the air flow rate of the at least one fan, so that acoustic noise variations are maintained below a predetermined limit.

34. The single closed loop cooling system and apparatus of claim 31, wherein the wherein the controller is configured to gradually decrease of air flow rate of the at least one fan so acoustic noise variations are maintained below a predetermined limit.

35. The single closed loop cooling system and apparatus of claim 31, wherein the wherein the controller is configured to decrease of the fluid flow rate of the at least one pump, with no increase of the air flow rate of the at least one fan.

36. The closed loop system and apparatus of claim 1 wherein the heat rejector comprises fins for heat dissipation.

37. The closed loop system and apparatus of claim 36 wherein the fan is coupled to the fins of the heat rejector.

38. A cooling system and apparatus for controlling the flow of a fluid through the cooling system comprising:
  a closed loop fluid path, having a fluid therein;
  a pump along the fluid path for circulating the fluid;
  a heat exchanger along the fluid path, the heat exchanger thermally coupled to a heat generating device from which waste heat is to be harvested, for transferring waste heat from the heat generating device to the fluid, the heat exchanger comprising a thermal capacitive material;

the heat rejecter along the fluid path for receiving waste heat from the fluid;

a fan thermally coupled to heat rejecter for circulating air about the heat rejecter for dissipating the waste heat;

a sensor along the fluid path for sensing one of temperature, pressure and flow rate of the fluid;

a temperature sensor directly coupled to the heat generating device for measuring a temperature of the heat generating device; and a controller in electrical communication with the sensor, the temperature sensor, the pump, and the fan, for controlling the pump and the fan according to an output from the sensor in order to regulate a temperature of the heat generating device so as to maintain the temperature of the heat generating device below a predetermined temperature.

39. A system for cooling comprising:

a heat generating device from which waste heat is to be harvested;

a closed loop fluid path, having a fluid therein;

a pump along the fluid path for circulating the fluid;

a heat exchanger along the fluid path, the heat exchanger thermally coupled to the heat generating device, for transferring the waste heat from the heat generating device to the fluid, the heat exchanger comprising a thermal capacitive material;

the heat rejecter along the fluid path for receiving waste heat from the fluid;

a fan thermally coupled to heat rejecter for circulating air about the heat rejecter for dissipating the waste heat;

a sensor along the fluid path for sensing one of temperature, pressure and flow rate of the fluid;

a temperature sensor directly coupled to the heat generating device for measuring a temperature of the heat generating device; and a controller in electrical communication with the sensor, the temperature sensor, the pump, and the fan, for controlling the pump and the fan according to an output from the sensor in order to regulate a temperature of the heat generating device so as to maintain the temperature of the heat generating device below a predetermined temperature.

* * * * *